US010008389B2

(12) United States Patent
Kang et al.

(10) Patent No.: US 10,008,389 B2
(45) Date of Patent: Jun. 26, 2018

(54) METHODS OF MANUFACTURING VERTICAL MEMORY DEVICES AT AN EDGE REGION

(71) Applicant: SAMSUNG ELECTRONICS CO., LTD., Suwon-si, Gyeonggi-do (KR)

(72) Inventors: Joo-Heon Kang, Seoul (KR); Jae-Joo Shim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/408,926

(22) Filed: Jan. 18, 2017

(65) Prior Publication Data

US 2017/0323798 A1   Nov. 9, 2017

(30) Foreign Application Priority Data

May 9, 2016  (KR) .......................... 10-2016-0056155

(51) Int. Cl.
  *H01L 21/311*  (2006.01)
  *H01L 27/11582*  (2017.01)

(52) U.S. Cl.
  CPC .. *H01L 21/31144* (2013.01); *H01L 27/11582* (2013.01)

(58) Field of Classification Search
  None
  See application file for complete search history.

(56) References Cited

U.S. PATENT DOCUMENTS

| 6,607,983 | B1 | 8/2003 | Chun et al. |
| 8,444,867 | B2 | 5/2013 | Yang |
| 8,871,591 | B2 | 10/2014 | Kwon et al. |
| 2012/0187471 | A1* | 7/2012 | Yu ..................... H01L 27/11565 257/324 |
| 2014/0057429 | A1* | 2/2014 | Oh ........................ H01L 21/308 438/613 |
| 2014/0197546 | A1 | 7/2014 | Hwang et al. |
| 2015/0069496 | A1 | 3/2015 | Shiga |

(Continued)

FOREIGN PATENT DOCUMENTS

| KR | 10-2001-0045597 A | 6/2001 |
| KR | 10-2001-0059550 A | 7/2001 |

(Continued)

*Primary Examiner* — Bilkis Jahan
(74) *Attorney, Agent, or Firm* — Lee & Morse P.C.

(57) ABSTRACT

A method of manufacturing a vertical memory device includes forming a preliminary first mold structure on a substrate, which includes main and edge regions, and the first preliminary mold structure including alternating insulation and sacrificial layers, forming a first mask on the preliminary first mold structure to expose the preliminary first mold structure between a boundary of the substrate and a first target position, partially etching the insulation and sacrificial layers using the first mask to form a preliminary second mold structure, forming a second mask on the preliminary second mold structure to expose the preliminary second mold structure between the boundary of the substrate and a second target position different from the first target position, and partially etching the insulation layers and the sacrificial layers using the second mask.

19 Claims, 53 Drawing Sheets

(56) References Cited

U.S. PATENT DOCUMENTS

| | | | |
|---|---|---|---|
| 2015/0137216 A1* | 5/2015 | Lee .................. | H01L 27/11582 257/329 |
| 2015/0214242 A1* | 7/2015 | Lee .................. | H01L 27/11582 257/314 |
| 2015/0340377 A1 | 11/2015 | Lee | |
| 2016/0170304 A1* | 6/2016 | Park ................. | H01L 21/31144 438/268 |
| 2017/0207220 A1* | 7/2017 | Yun ................... | H01L 27/1052 |

FOREIGN PATENT DOCUMENTS

| | | |
|---|---|---|
| KR | 10-2001-0073628 A | 8/2001 |
| KR | 10-2001-0093006 A | 10/2001 |
| KR | 10-2005-0069712 A | 7/2005 |
| KR | 10-0583167 B1 | 5/2006 |
| KR | 10-0595319 B1 | 6/2006 |
| KR | 10-0728990 B1 | 6/2007 |
| KR | 10-2010-01119163 A | 11/2010 |

\* cited by examiner

METHODS OF MANUFACTURING VERTICAL MEMORY DEVICES AT AN EDGE REGION

CROSS-REFERENCE TO RELATED APPLICATION

Korean Patent Application No. 10-2016-0056155, filed on May 9, 2016, in the Korean Intellectual Property Office, and entitled: "Methods of Manufacturing Vertical Memory Devices," is incorporated by reference herein in its entirety.

BACKGROUND

1. Field

Example embodiments relate to methods of manufacturing vertical memory devices. More particularly, example embodiments relate to methods of manufacturing vertical memory devices on an edge region of a substrate.

2. Description of the Related Art

A semiconductor substrate may include a main region, in which a main chip is formed, and an edge region, in which a main chip is not formed. In the fabrication of a memory device, when a plurality of layers and a plurality of structures are formed on the main region, the layers and the structures may be also formed on the edge region. Thus, an edge exposure wafer (EEW) process may be performed to remove portions of layers and structures from the edge region in order to prevent or minimize substrate contamination in subsequent manufacturing stages.

SUMMARY

According to example embodiments, there is provided a method of manufacturing a vertical memory device. In the method, a preliminary first mold structure may be formed on a substrate including a main region and an edge region. The first preliminary mold structure may include insulation layers and sacrificial layers alternately and repeatedly stacked. A first mask may be formed on the preliminary first mold structure. The first mask may expose an upper surface of the preliminary first mold structure on a region from a boundary of the substrate to a first target position. The insulation layers and the sacrificial layers may be partially etched using the first mask as an etching mask to form a preliminary second mold structure including a preliminary step structure. A second mask may be formed on the preliminary second mold structure. The second mask may expose an upper surface of the preliminary second mold structure on a region from the boundary of the substrate to a second target position, wherein the second target position is different from the first target position. The insulation layers and the sacrificial layers may be partially etched using the second mask as an etching mask to form a mold structure on the main region and the edge region of the substrate, wherein the mold structure on the edge region includes a first step portion formed by using the first mask and a second step portion formed by using the second mask.

According to example embodiments, there is provided a method of manufacturing a vertical memory device. In the method, a preliminary mold structure may be formed on a substrate including a main region and an edge region. The preliminary mold structure may include insulation layers and sacrificial layers alternately and repeatedly stacked. A first mask may be formed on the preliminary mold structure on the main region of the substrate. The first mask may serve as a mask for forming a step structure of the preliminary mold structure. A second mask may be formed on the preliminary mold structure on the edge region of the substrate. The second mask may expose an upper surface of the preliminary mold structure on a first region from a boundary of the substrate to a first target position. The insulation layers and the sacrificial layers may be partially etched using the first and second masks as an etching mask to form a first preliminary mold structure on the main region of the substrate and a second preliminary mold structure on the edge region of the substrate. A third mask may be formed on the preliminary first mold structure. The third mask may serve as a mask for forming a step structure of the preliminary first mold structure. A fourth mask may be formed on the preliminary second mold structure. The fourth mask may expose an upper surface of the preliminary second mold structure on a region from the boundary of the substrate to a second target position, wherein the second target position is different from the first target position. The insulation layers and the sacrificial layers using the third and fourth masks as an etching mask to form a second mold structure on the main region of the substrate and a first mold structure on the edge region of the substrate. A sidewall of the second mold structure includes a first step structure, and a sidewall of the first mold structure includes a second step structure different from the first step structure.

According to example embodiments, there is provided a method of manufacturing a vertical memory device, including forming a preliminary first mold structure on a substrate, the substrate including a main region and an edge region, and the first preliminary mold structure including insulation layers and sacrificial layers alternately and repeatedly stacked, forming a first mask on the preliminary first mold structure, the first mask exposing an upper surface of the preliminary first mold structure in a region between a boundary of the substrate and a first target position, partially etching the insulation layers and the sacrificial layers using the first mask as an etching mask to form a preliminary second mold structure including a preliminary step structure, forming a second mask on the preliminary second mold structure, the second mask exposing an upper surface of the preliminary second mold structure in a region between the boundary of the substrate and a second target position, wherein the second target position is farther from the boundary of the substrate than the first target position, and partially etching the insulation layers and the sacrificial layers using the second mask as an etching mask to form a mold structure on the main region and the edge region of the substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Various example embodiments will be described more fully hereinafter with reference to the accompanying drawings, in which some example embodiments are shown.

Figure 1:
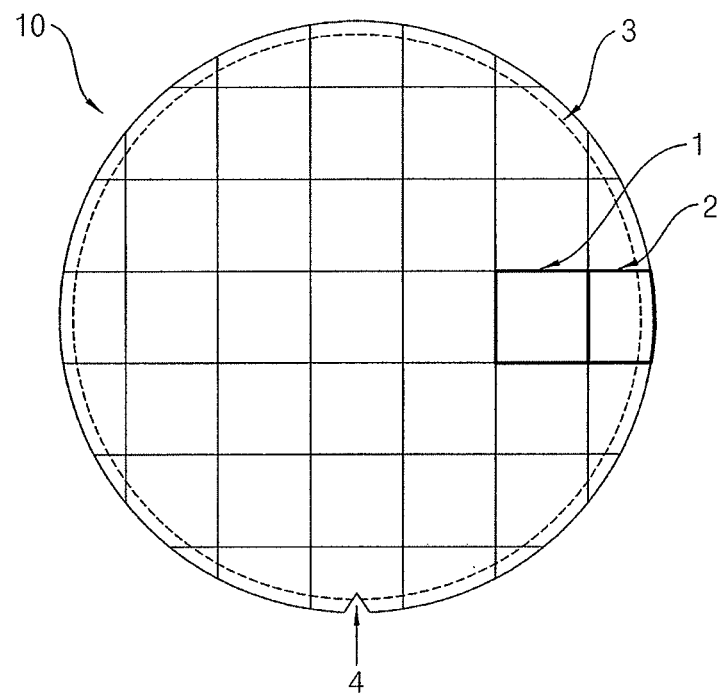
FIGS. 1 and 2 illustrate plan views of regions of a substrate in accordance with example embodiments.
Figure 2:
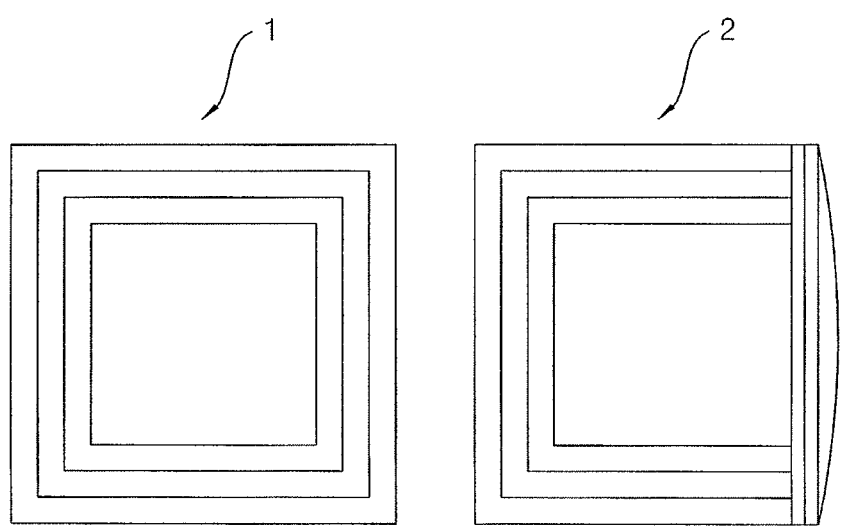
Figure 3A:
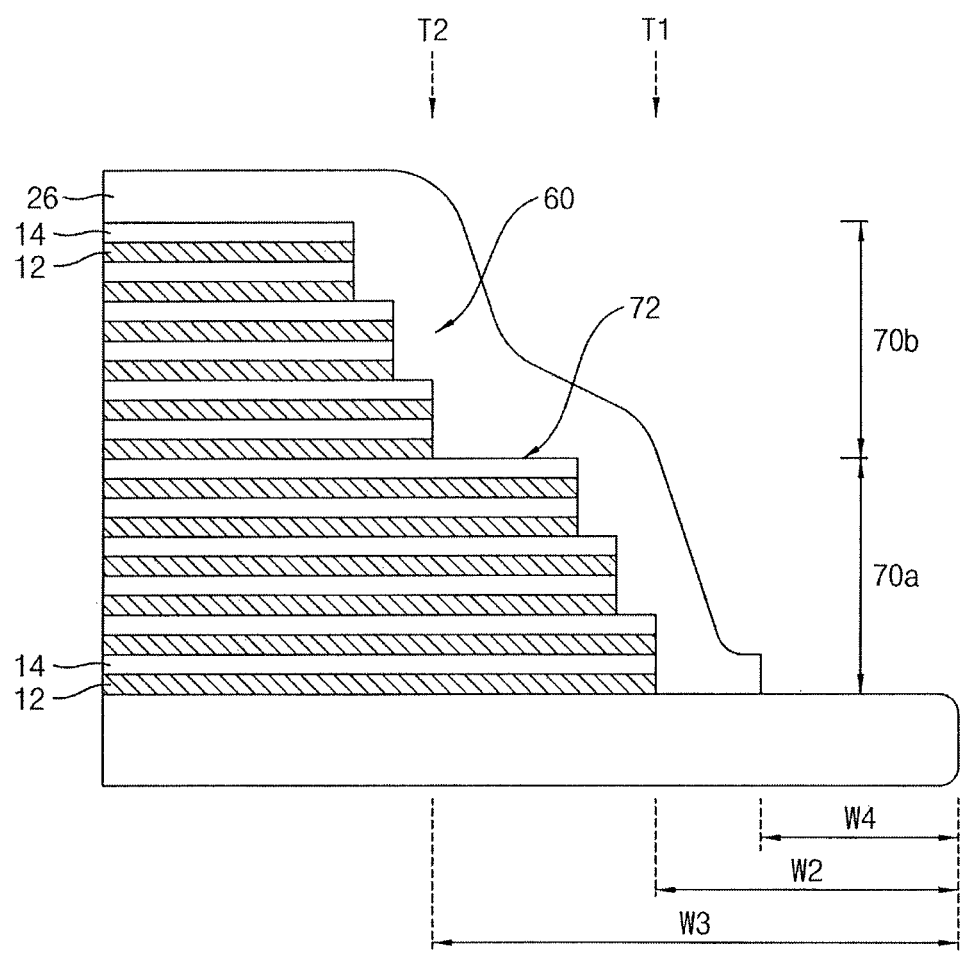
FIGS. 3A and 3B illustrate cross-sectional views of vertical memory devices formed on an edge region and on a main region, respectively, of a substrate in accordance with example embodiments.
Figure 3B:
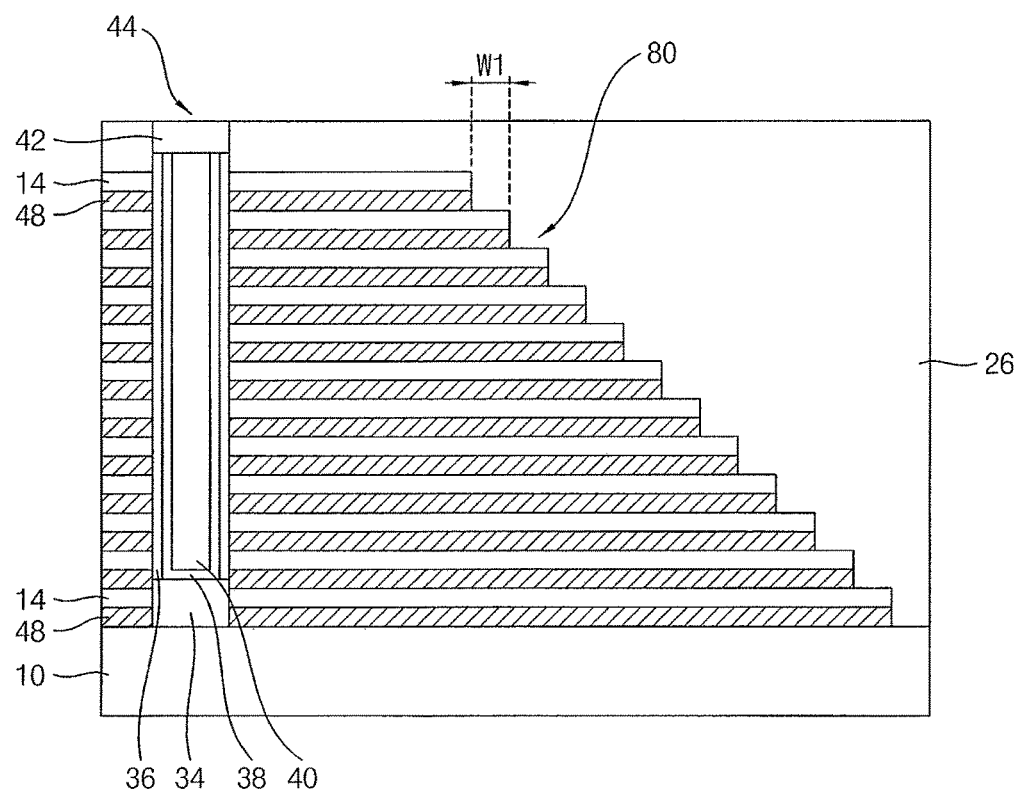

FIGS. 1 and 2 are plan views illustrating regions of a substrate, and FIGS. 3A and 3B are cross-sectional views illustrating a vertical memory device formed on an edge region and on a main region, respectively, of the substrate in accordance with example embodiments. FIG. 2 is an enlarged view of the main region and the edge region of FIG. 1.

Referring to FIGS. 1, 2, 3A and 3B, a substrate 10 may include a main region 1, i.e., a region in which a main chip is formed, and an edge region 2, i.e., a region in which the main chip is not formed. The edge region 2 may include a bevel region 3, i.e., a region which may be an annular area having a given width from a boundary of the substrate 10.

The substrate 10 may include a semiconductor material, e.g., silicon and/or germanium. In example embodiments, the substrate 10 may include a notch portion 4. Alternatively, the substrate 10 may include a flat zone.

A plurality of vertical memory cells may be formed on the main region 1 of the substrate 10, as shown in FIG. 3B. The vertical memory cell may include a conductive pattern structure 80, which may include a plurality of gates 48 and a plurality of first insulation layers 14 alternately and repeatedly stacked, and a vertical channel structure 44 through the conductive pattern structure 80.

The vertical channel structure 44 may fill a channel hole that may extend through the conductive pattern structure 80 and expose an upper surface of the substrate 10. The vertical channel structure 44 may include a channel 38, a charge storage structure 36 including a tunnel insulation layer, a charge storage layer and a blocking dielectric layer, and a filling insulation pattern 40. In example embodiments, a semiconductor pattern 34 may be formed between the upper surface of the substrate 10 and the vertical channel structure 44. A pad pattern 42 may be formed on the vertical channel structure 44 in an upper portion of the channel hole.

Sidewalls of the conductive pattern structure 80 may have a step structure including a plurality of steps. An, e.g., exposed, upper surface of each of the steps included in the conductive pattern structure 80 may have a first width W1 in a first direction, and thus the, e.g., exposed, upper surfaces of the steps may have substantially the same widths as each other. Wirings may be formed on the upper surfaces of the steps, respectively.

In example embodiments, the vertical memory cell may be a cell of a vertical NAND flash memory device.

Referring to FIG. 3A, a first mold structure 60 may be formed on the edge region 2 of the substrate 10. The first mold structure 60 may include a plurality of first sacrificial layers 12 and a plurality of first insulation layers 14 alternately and repeatedly stacked. In example embodiments, the first sacrificial layer 12 may include a nitride, e.g., silicon nitride, and the first insulation layer 14 may include an oxide include, e.g., silicon oxide.

One of the sidewalls of the first mold structure 60 may have a step structure different from the step structure of the conductive pattern structure 80. In detail, the first mold structure 60 may have a first sidewall adjacent to the bevel region 3 and second sidewalls different from the first sidewall. In example embodiments, the first sidewall of the first mold structure 60 may have the step structure different from the step structure of the conductive pattern structure 80, and each of the second sidewalls may have the same step structure as the conductive pattern structure 80.

Hereinafter, the first sidewall of the first mold structure 60 will be described. As illustrated in FIG. 3A, the first sidewall of the first mold structure 60 may include a first step portion 70a and a second step portion 70b above the first step portion 70a. A step layer 72 may be formed between the first and second step portions 70a and 70b, so that the first and second step portions 70a and 70b may be distinguished from each other by the step layer 72. In example embodiments, an upper surface of the step layer 72 may have a width in the first direction greater than a width in the first direction of an upper surface of each step of the first and second step portions 70a and 70b.

The first sidewall of the first mold structure 60 may be formed by an edge exposure wafer (EEW) process. Thus, the first sidewall of the first mold structure 60 may be formed to have various shapes according to a target position of exposure.

The first step portion 70a of the first mold structure 60 may be formed by the EEW process using a first target position T1, e.g., using the first target position T1 as a point for performing exposure to remove material from the substrate 10. The second step portion 70b of the first mold structure 60 may be formed by the EEW process using a second target position T2, e.g. using the second target position T2 as a point for performing exposure to remove material from the substrate 10.

In example embodiments, the first target position T1 may be spaced apart from the boundary of the substrate 10 by a second width W2 in the first direction toward an inner portion of the substrate 10. The second target position T2 may be spaced apart from the boundary of the substrate 10 by a third width W3 in the first direction toward the inner portion of the substrate 10. The third width W3 may be greater than the second width W2. In example embodiments, a difference between the second and third widths W2 and W3 may be greater than a range of a tolerance (or an error) in the EEW process.

In the step structure of the first sidewall of the first mold structure 60, a width between a closest portion and a farthest portion from the boundary of the substrate 10 is referred to as a width in a horizontal direction. The width in the horizontal direction may be greater than a range of a tolerance of the target position in the EEW process. For example, when the tolerance of the target position in the EEW process is +/−0.1 mm, the range of a tolerance of the target position in the EEW process may be about 0.2 mm. The first and second step portions 70a and 70b may be formed by EEW processes at the first and second target positions T1 and T2, respectively, and thus the tolerance of the first target position T1 may be in a range of about 0.2 mm, and the tolerance of the second target position T2 may be in a range of about 0.2 mm. The width in the horizontal direction of the step structure of the first sidewall of the first mold structure 60 may be greater than about 0.2 mm In example embodiments, an end of the first step portion 70a may be located within the range of the tolerance from the first target position T1. An end of the second step portion 70b may be located within the range of the tolerance from the second target position T2. Thus, an area of the substrate 10 for forming the first and second step portions 70a and 70b may increase, e.g., when compared to a mold structure formed by EEW processes using only one target position of exposure. Additionally, the first mold structure 60 may include a step structure having a gentle slope, e.g., when compared to a mold structure formed by an EEW process using only one target position of exposure to define a step structure with a single steep slope.

According to the tolerance in the EEW process, a plurality of steps included in the first and second step portions 70a and 70b may have various shapes.

In some example embodiments, a portion of the first mold structure 60 may have a structure including conductive patterns and the first insulation layers 14 alternately and repeatedly stacked, and another portion of the first mold structure 60 may have a structure including the first sacrificial layers 12 and the first insulation layers 14 alternately and repeatedly stacked. The conductive pattern may include a material substantially the same as a material of the gate 48 in the conductive pattern structure 80.

An insulating interlayer 26 may be formed on the substrate 10 to cover the conductive pattern structure 80 on the main region 1 and the first mold structure 60 on the edge region 2. For example, the insulating interlayer 26 may not be formed on an edge portion of the substrate 10, e.g., the insulating interlayer 26 may not be formed on a portion of the substrate 10 exposed by the first mold structure 60 and immediately adjacent to the boundary of the substrate 10. That is, the edge portion of the substrate 10 may be exposed by the insulating interlayer 26. A width in the first direction of the edge portion of the substrate 10 may have a fourth width W4 less than the second width W2.

FIGS. 4A to 21B are cross-sectional views illustrating stages of a method of manufacturing a vertical memory device in accordance with example embodiments. In detail, FIGS. 4A, 5A, 6A, 7A . . . and 21A show a portion of the vertical memory device on the edge region 2, and FIGS. 4B, 5B, 6B, 7B . . . and 21B show a portion of the vertical memory device on the main region 1.

Figure 4A:
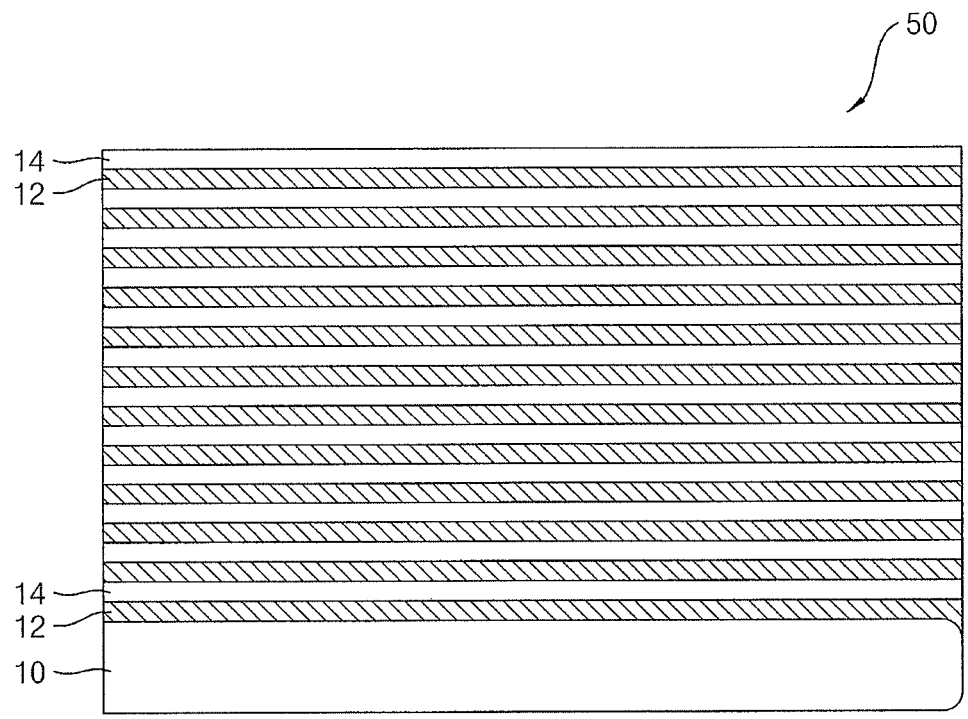
FIGS. 4A to 21B illustrate cross-sectional views of stages in a method of manufacturing a vertical memory device in accordance with example embodiments.
Figure 4B:
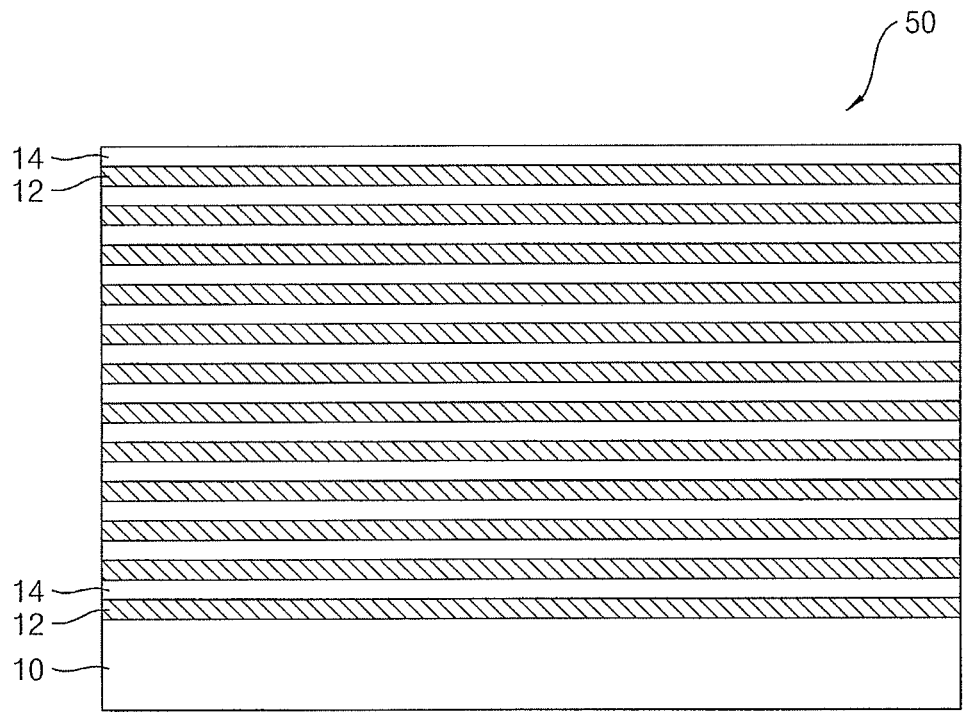

Referring to FIGS. 4A and 4B, the first sacrificial layers 12 and the first insulation layers 14 may be alternately and repeatedly formed on the substrate 10, so that a preliminary mold structure 50 may be formed on the substrate 10.

The substrate 10 may include the main region and the edge region. The edge region may include a bevel region, which may be an annular area having a given width from the boundary of the substrate 10. The substrate 10 may include a semiconductor material, e.g., silicon and/or germanium.

A portion of the preliminary mold structure 50 on the main region of the substrate 10 may be transformed into a second mold structure including a step structure by subsequent processes. A portion of the preliminary mold structure 50 on the edge region of the substrate 10 may be transformed into the first mold structure including a step structure different from the step structure of the second mold structure by subsequent processes. In example embodiments, the step structure of a first sidewall of the first mold structure adjacent the bevel region may be different from the step structure of the second mold structure.

In example embodiments, the first sacrificial layer 12 and the first insulation layer 14 may be formed by, e.g., a chemical vapor deposition (CVD) process, a plasma enhanced CVD (PE-CVD) process, or an atomic layer deposition (ALD) process. In example embodiments, a pad insulation layer may be further formed directly on the substrate 10 by a thermal oxidation process.

In example embodiments, the first insulation layer 14 may be formed of an oxide-based material, e.g., silicon oxide. The first sacrificial layer 12 may be formed of a material that may have an etching selectivity with respect to the first insulation layer 14, and may be easily removed by a wet etching process. For example, the first sacrificial layer 12 may be formed of a nitride-based material, e.g., silicon nitride and/or silicon boronitride.

In example embodiments, the first sacrificial layers 12 may be replaced with gates 48 (refer to FIGS. 21A and 21B) by subsequent processes, respectively. Thus, the number of the first sacrificial layers 12 may be substantially the same as the number of the gates 48. That is, the first sacrificial layers 12 may be replaced with one of a ground selection line (GSL), a word line and a string selection line (SSL).

Figure 5A:
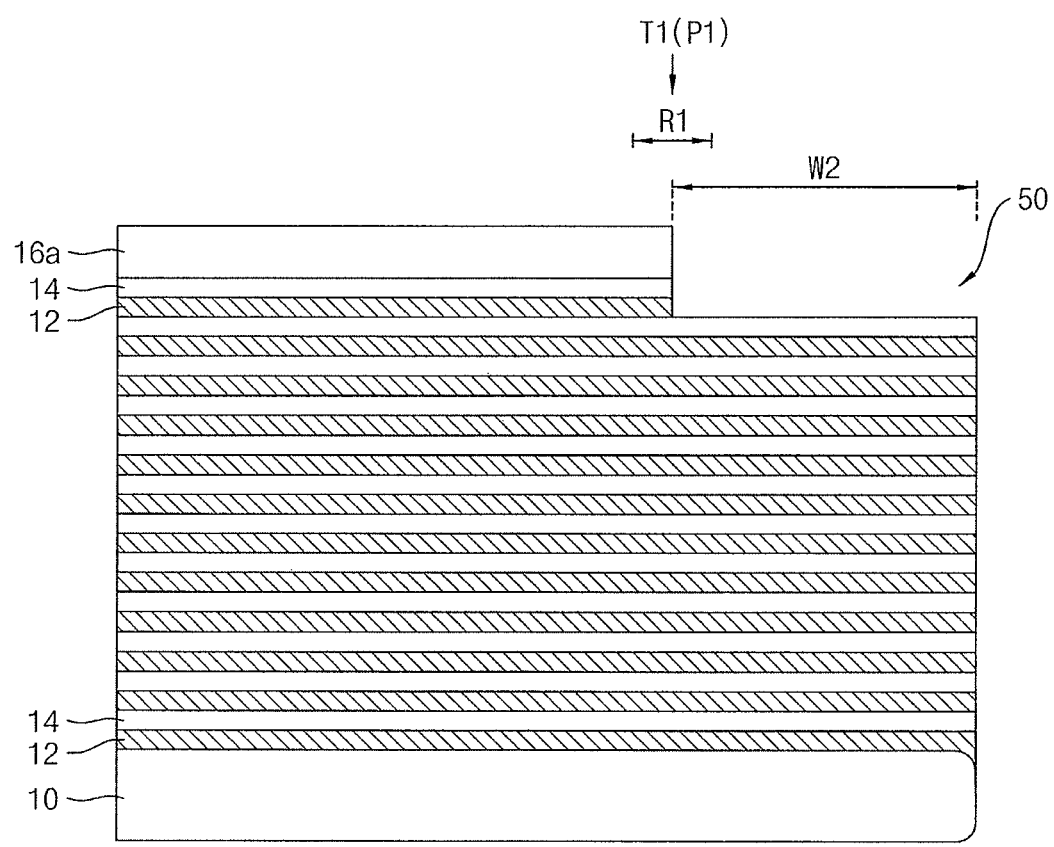
Figure 5B:
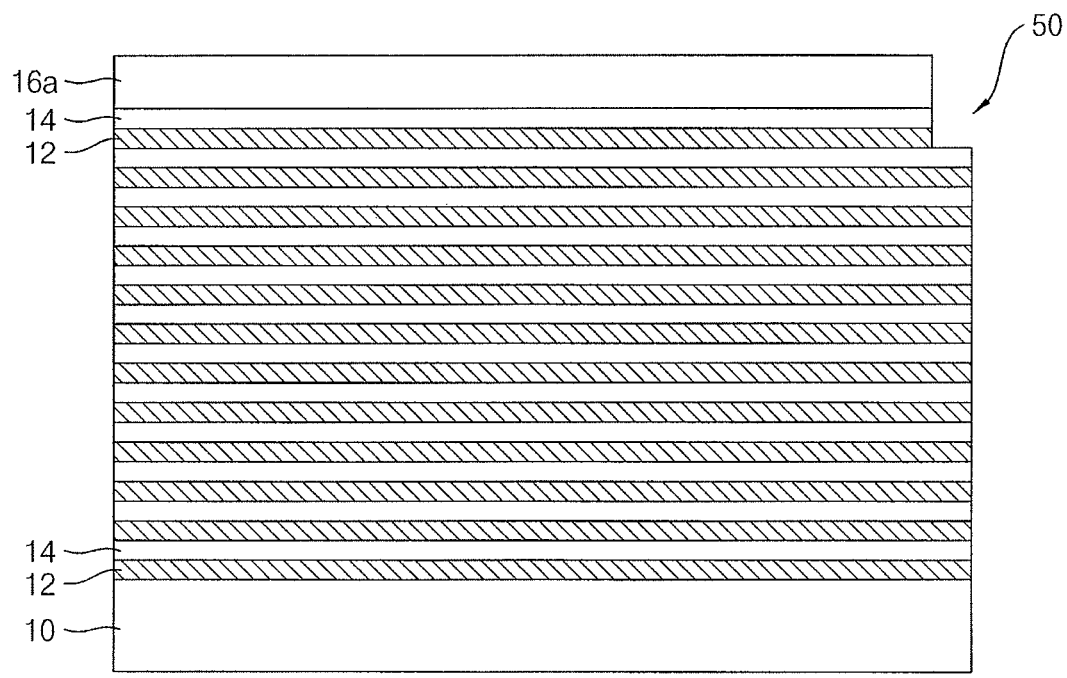

Referring to FIGS. 5A and 5B, a first photoresist film may be coated on the preliminary mold structure 50, and the first photoresist film may be exposed and developed to form a first photoresist pattern 16a.

If a photoresist film on the main region and the edge region is exposed using the same exposure mask (or reticle), the photoresist film on the bevel region may be abnormally exposed, because an area of the edge region may be less than an area of the main region. Thus, after the exposure process of the photoresist film on the main region and the edge region, an EEW process for removing the photoresist film from the bevel region may be further performed.

In detail, a first photoresist film may be coated on the preliminary mold structure 50, and may be exposed by a first exposure process. The first exposure process may be performed to form the second mold structure on the main region of the substrate 10. Also, an EEW process may be performed to remove the first photoresist film on the edge region. Then, the first photoresist film may be developed.

Thus, the first photoresist pattern 16a may be formed on the main region and the edge region. A portion of the first photoresist pattern 16a on the main region may serve as an etching mask for forming the second mold structure, and a portion of the first photoresist pattern 16a on the edge region may serve as an etching mask for forming the first mold structure.

As shown in FIG. 5A, a shape and a position of the first sidewall of the first mold structure may be determined by a target position of the EEW process. In the EEW process, the first target position T1 may be used.

In example embodiments, the first target position T1 may be spaced apart from the boundary of the substrate 10 by the second width W2 in the first direction toward the inner portion of the substrate 10. In example embodiments, the second width W2 in the first direction may be in a range of about 0.5 mm to about 1.5 mm.

In the EEW process, a tolerance (or an error) between the target position of exposure and a real exposed position may be generated according to the ability of an exposure apparatus. Thus, a real end portion of the first photoresist pattern 16a may be located at a first position P1, which may be located in a range R1 of the tolerance from the first target position T1. For example, when the tolerance of the target position of exposure is +/−0.1 mm, the range of the tolerance of the target position of exposure may be about 0.2 mm. Thus, the first position P1 may be located in a range of +/−0.1 mm from the first target position T1 of exposure. A maximum difference between each of the first positions P1 may be about 0.2 mm.

FIG. 5A shows that the first position P1 is exactly aligned with the first target position T1. However, the first position P1 may not be exactly aligned with the first target position T1 because an align key may not be used in the EEW process.

An uppermost one of the first insulation layers 14 and an uppermost one of the first sacrificial layers 12 in the preliminary mold structure 50 may be etched using the first photoresist pattern 16a as an etching mask. Thus, one step may be formed at a sidewall of the preliminary mold structure 50 on the main region and the edge region.

Alternatively, at least two of the first insulation layers 14 and at least two of the first sacrificial layers 12 in the preliminary mold structure 50 may be etched using the first photoresist pattern 16a as an etching mask. In this case, at least two of the first insulation layers 14 and at least two of the first sacrificial layers 12 in the preliminary mold structure 50 be removed in each subsequent etching process.

Figure 6A:
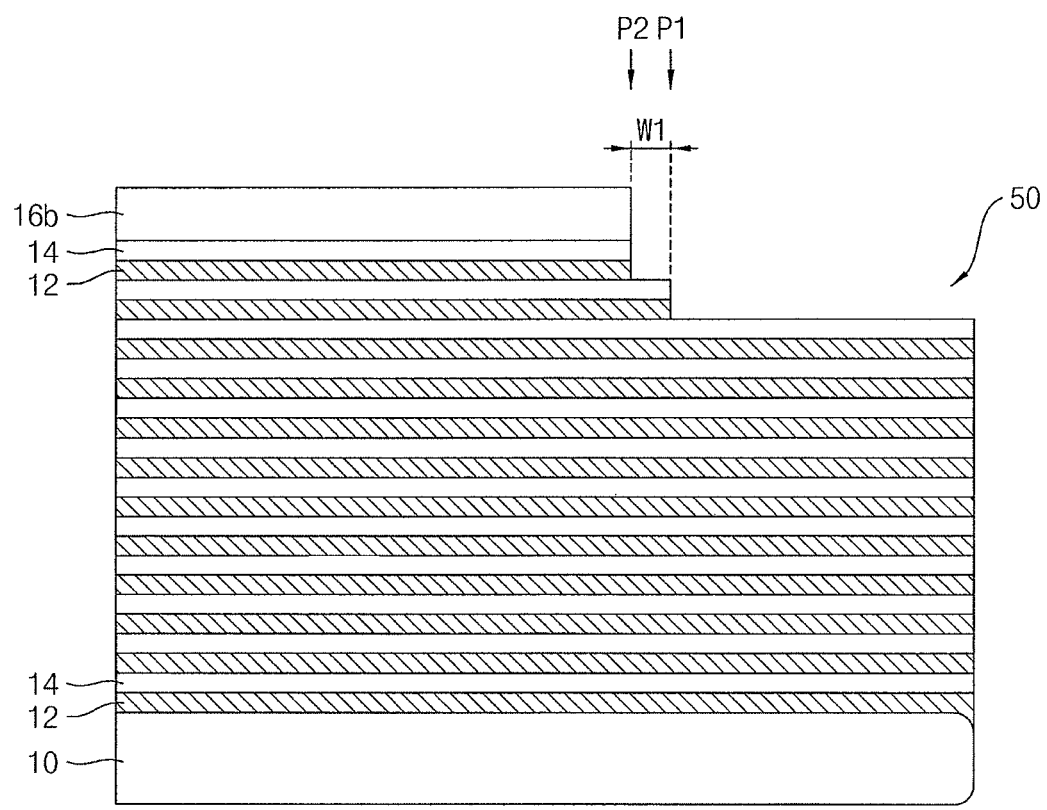
Figure 6B:
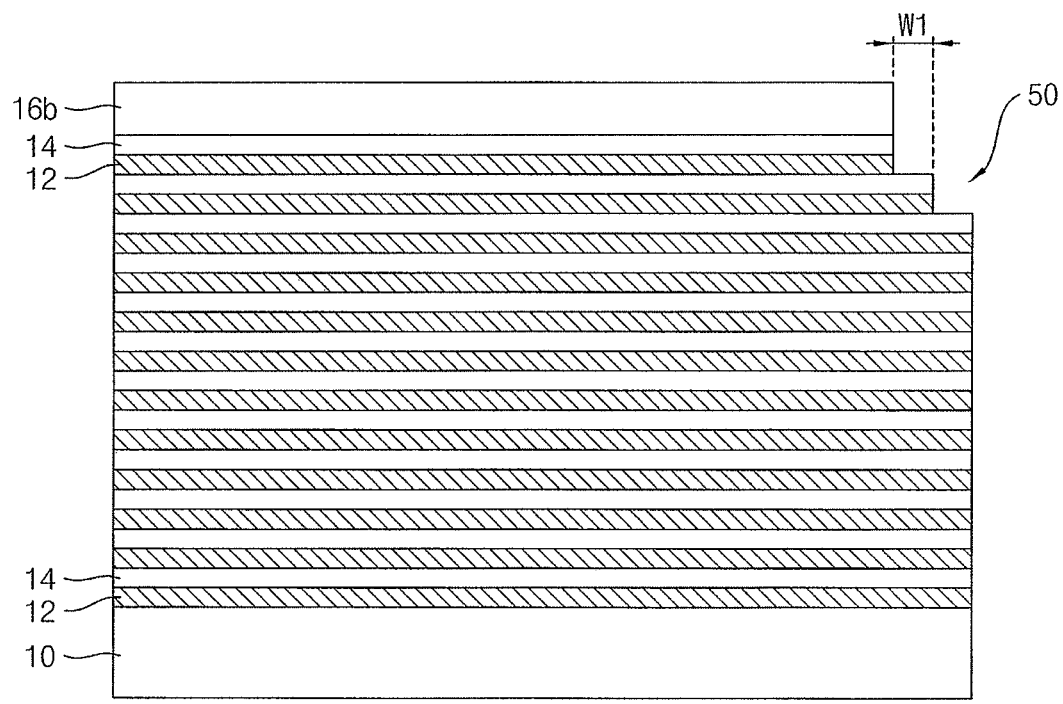

Referring to FIGS. 6A and 6B, a second photoresist pattern 16b may be formed by a trimming process of the first photoresist pattern 16a.

In example embodiments, the first photoresist pattern 16a may be removed by the first width W1 in the first direction by the trimming process. The first width W1 in the first direction may be less than the range of the tolerance of the target position of exposure in the EEW process. In example embodiments, the first width W1 in the first direction may be in a range of about 100 nm to about 2000 nm. A width in the first direction of an upper surface of a step in the second mold structure subsequently formed may be determined by the first width W1.

In example embodiments, an end portion of the second photoresist pattern 16b on the edge region may be located at a second position P2. The second position P2 may be spaced apart from the boundary of the substrate 10 by the first width W1 in the first direction toward an inner portion of the substrate 10. Exposed upper ones of the first insulation layers 14 and respective upper ones of the first sacrificial layers 12 therebeneath in the preliminary mold structure 50 may be etched using the second photoresist pattern 16b as an etching mask.

Figure 7A:
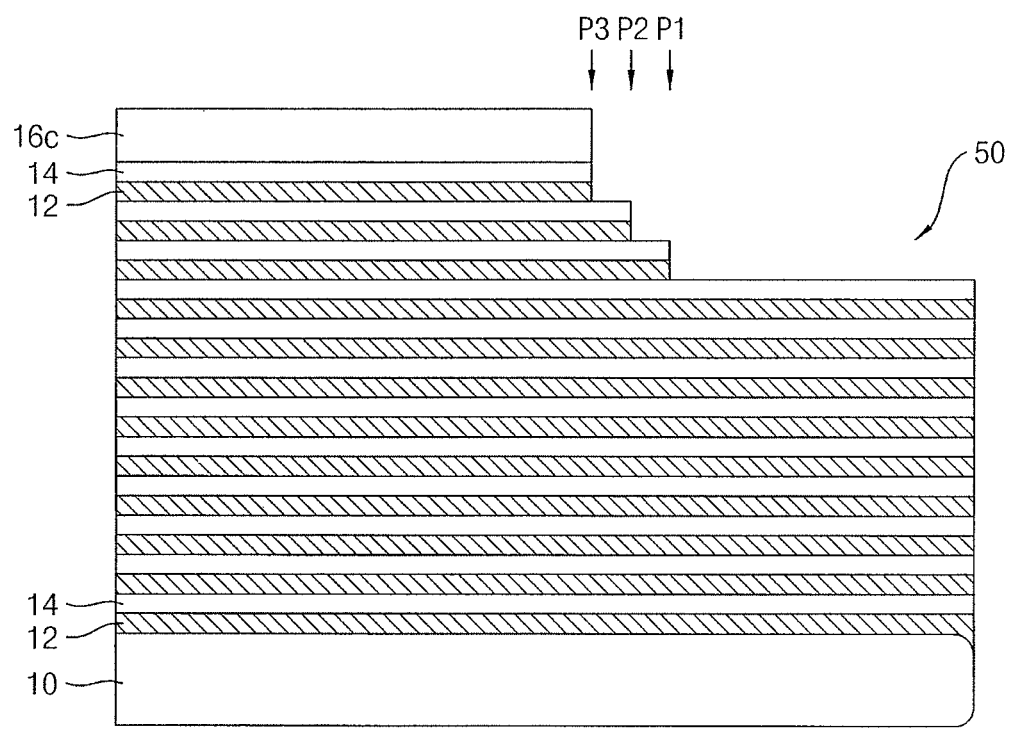
Figure 7B:
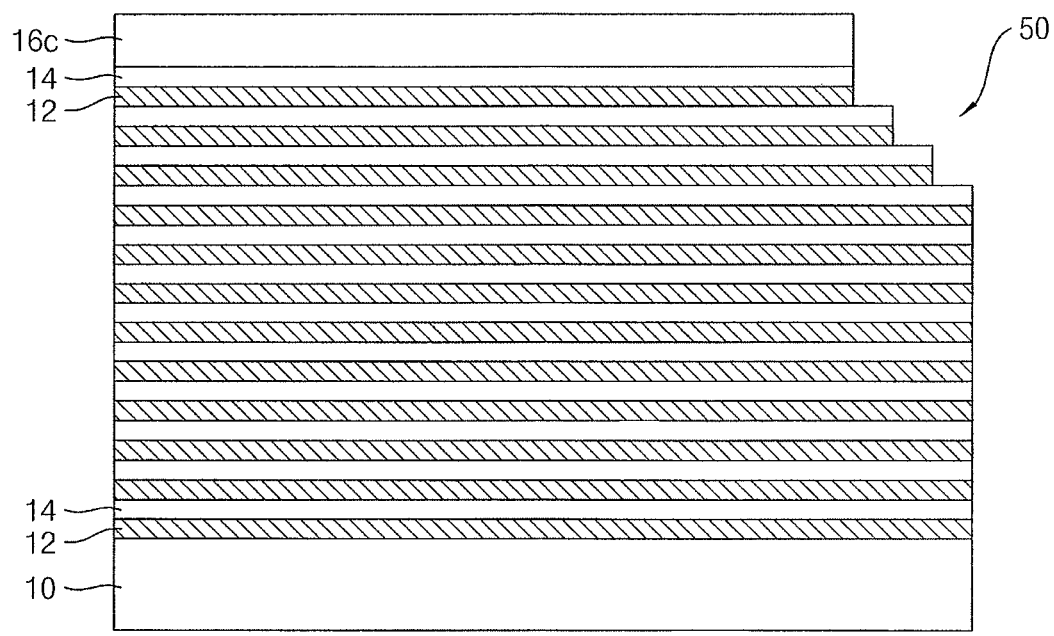

Referring to FIGS. 7A and 7B, a third photoresist pattern 16c may be formed by a trimming process of the second photoresist pattern 16b. Exposed upper ones of the first insulation layers 14 and respective upper ones of the first sacrificial layers 12 therebeneath in the preliminary mold structure 50 may be etched using the third photoresist pattern 16c as an etching mask.

In example embodiments, the second photoresist pattern 16b may be removed by the first width W1 in the first direction by the trimming process. Thus, an end portion of the third photoresist pattern 16c on the edge region may be located at a third position P3 spaced apart from the second position P2 by the first width W1 in the first direction.

In example embodiments, the trimming process may be repeatedly performed until the photoresist pattern may not have a thickness enough to be used as the etching mask. In the present embodiment, the trimming process may be performed twice per each photoresist pattern.

Figure 8A:
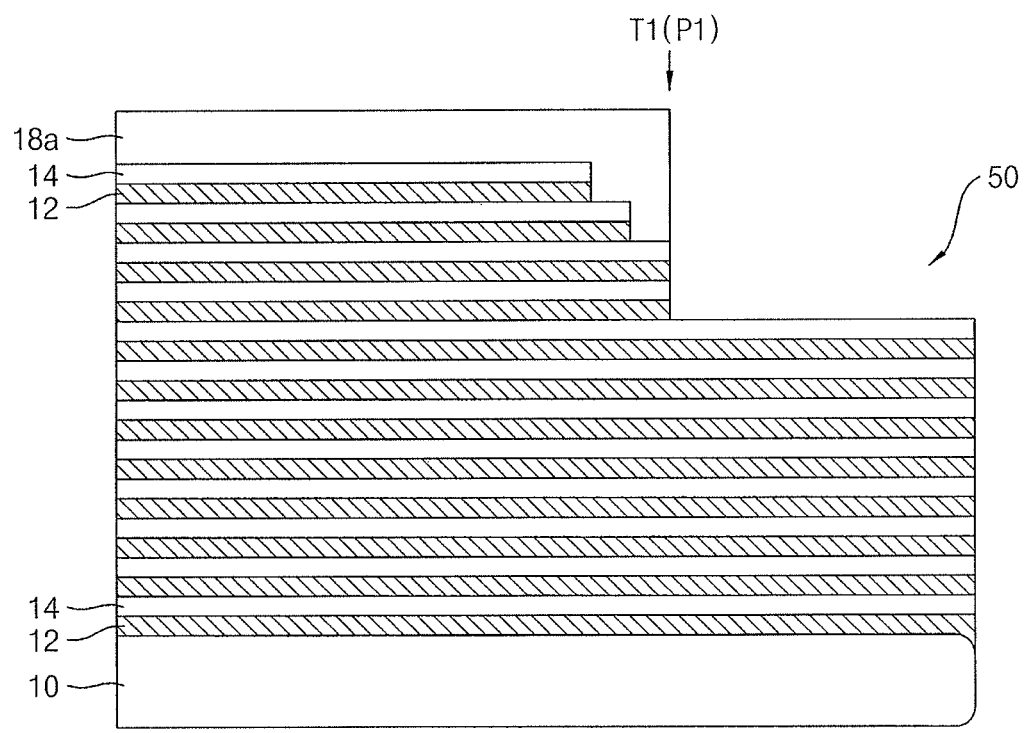
Figure 8B:
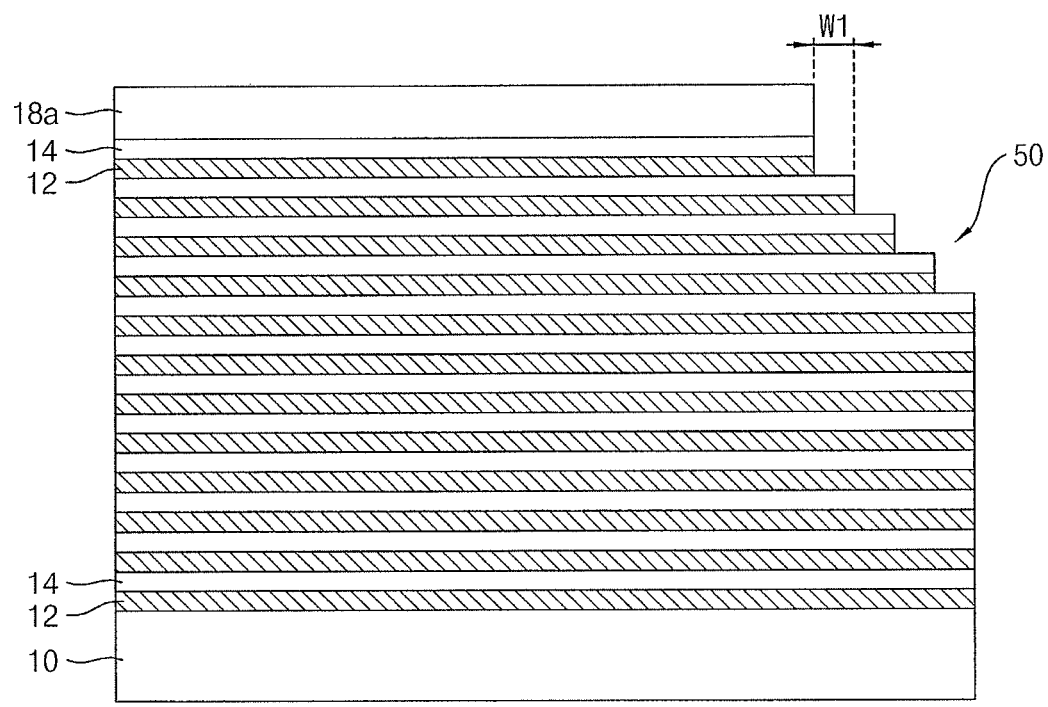

Referring to FIGS. 8A and 8B, a second photoresist film may be coated on the preliminary mold structure 50, and the second photoresist film may be exposed and developed to form a fourth photoresist pattern 18a.

In detail, a second photoresist film may be formed on the preliminary mold structure 50 on the main region and the edge region. The second photoresist film may be exposed by a first exposure process. The first exposure process may be performed to form the second mold structure on the main region. Also, an EEW process may be performed to remove the second photoresist film on the edge region. The second photoresist film may be developed to form the fourth photoresist pattern 18a on the main region and the edge region.

Referring to FIG. 8A, in the EEW process, the first target position T1 of exposure may be used. For example, when the first target position T1 is exactly aligned with the first position P1 without a tolerance, an end portion of the fourth photoresist pattern 18a may be located at the first position P1 substantially the same as the first target position T1. In another example, when the first target position T1 is not aligned with the first position P1, e.g., due to tolerance of the target position of exposure, a shape of the step of the preliminary mold structure 50 may be changed, as will be described later.

Referring to FIG. 8B, the fourth photoresist pattern 18a on the main region may be formed to form the second mold structure having a staircase shape. Thus, the fourth photoresist pattern 18a on the main region may expose an edge portion of an uppermost layer in the preliminary mold structure 50. In example embodiments, the exposed portion of the uppermost layer in the preliminary mold structure 50 may have the first width W1 in the first direction.

Exposed upper ones of the first insulation layers 14 and respective upper ones of the first sacrificial layers 12 therebeneath in the preliminary mold structure 50 may be etched using the fourth photoresist pattern 18a as an etching mask. Thus, a portion of a step structure may be formed at a sidewall of the preliminary mold structure 50 on the main region and the edge region.

Figure 9A:
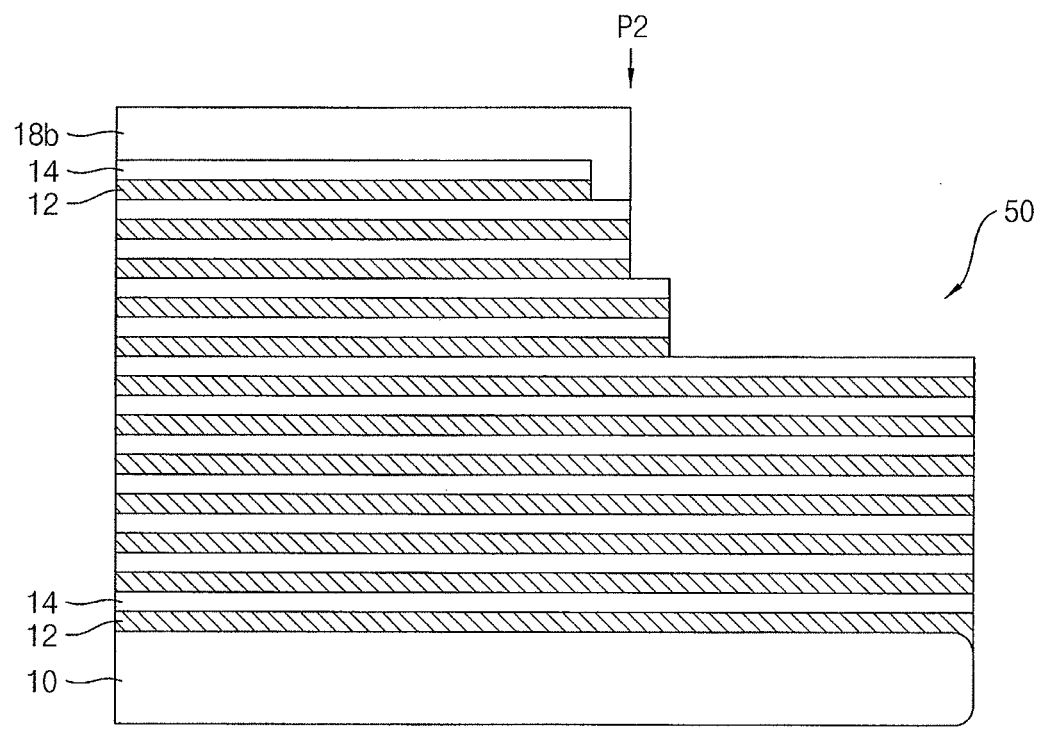
Figure 9B:
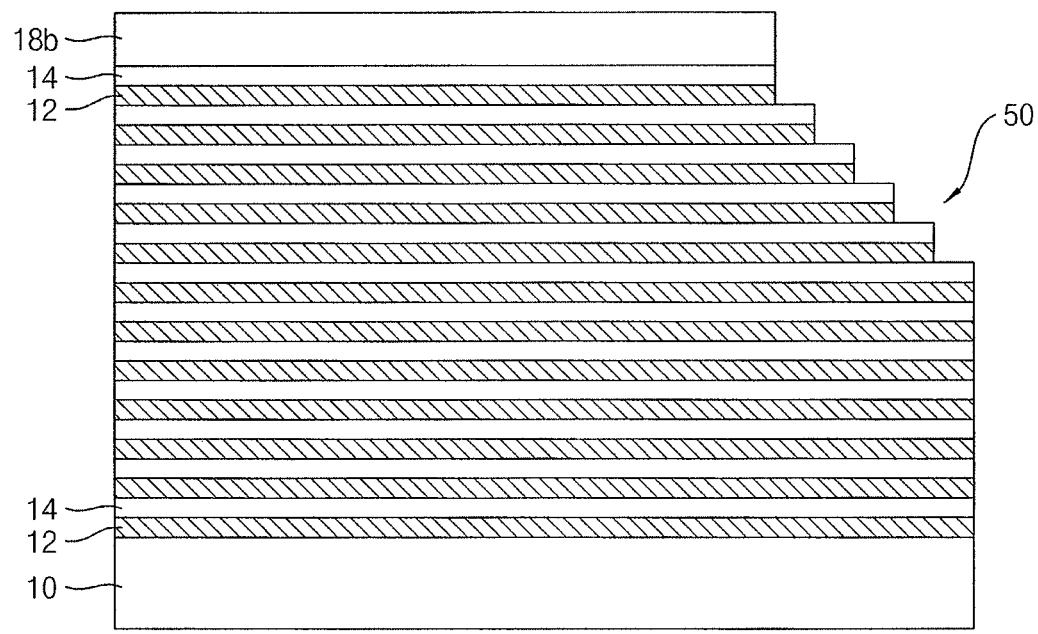

Referring to FIGS. 9A and 9B, a fifth photoresist pattern 18b may be formed by a trimming process of the fourth photoresist pattern 18a. Exposed upper ones of the first insulation layers 14 and upper ones of the first sacrificial layers 12 therebeneath in the preliminary mold structure 50 may be etched using the fifth photoresist pattern 18b as an etching mask. In example embodiments, the fourth photoresist pattern 18a may be partially removed by the first width W1 in the first direction during the trimming process.

Figure 10A:
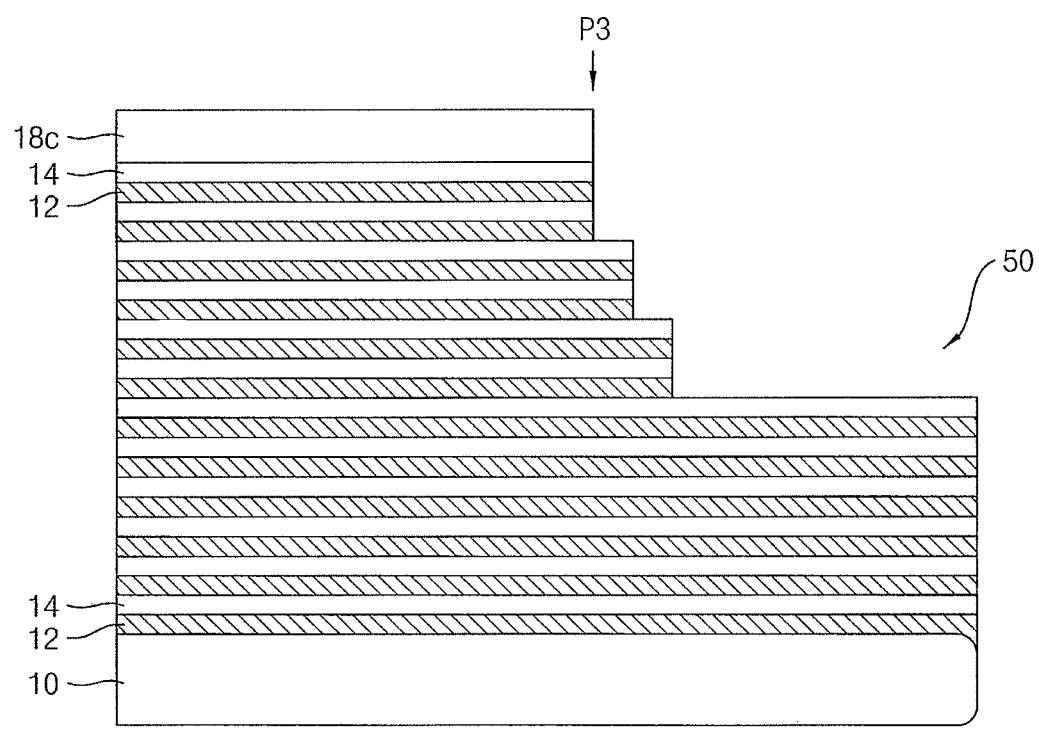
Figure 10B:
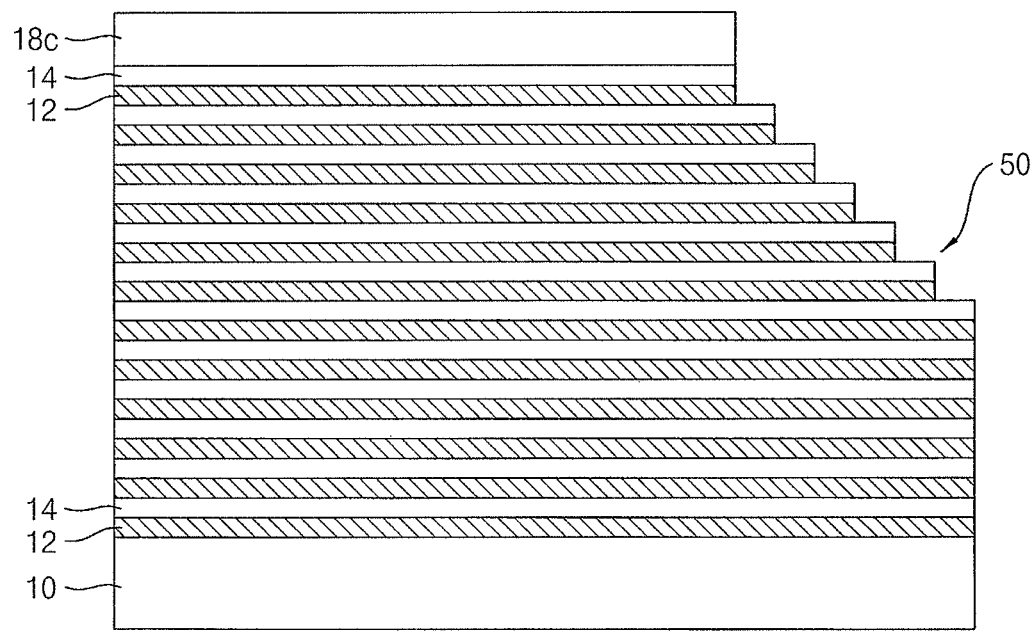

Referring to FIGS. 10A and 10B, a sixth photoresist pattern 18c may be formed by a trimming process of the fifth photoresist pattern 18b. Exposed upper ones of the first insulation layers 14 and upper ones of the first sacrificial layers 12 therebeneath in the preliminary mold structure 50 may be etched using the sixth photoresist pattern 18c as an etching mask. In example embodiments, the fifth photoresist pattern 18b may be partially removed by the first width W1 in the first direction during the trimming process.

Thus, a portion of a step structure may be formed at a sidewall of the preliminary mold structure 50 on the main region and the edge region.

Figure 11A:
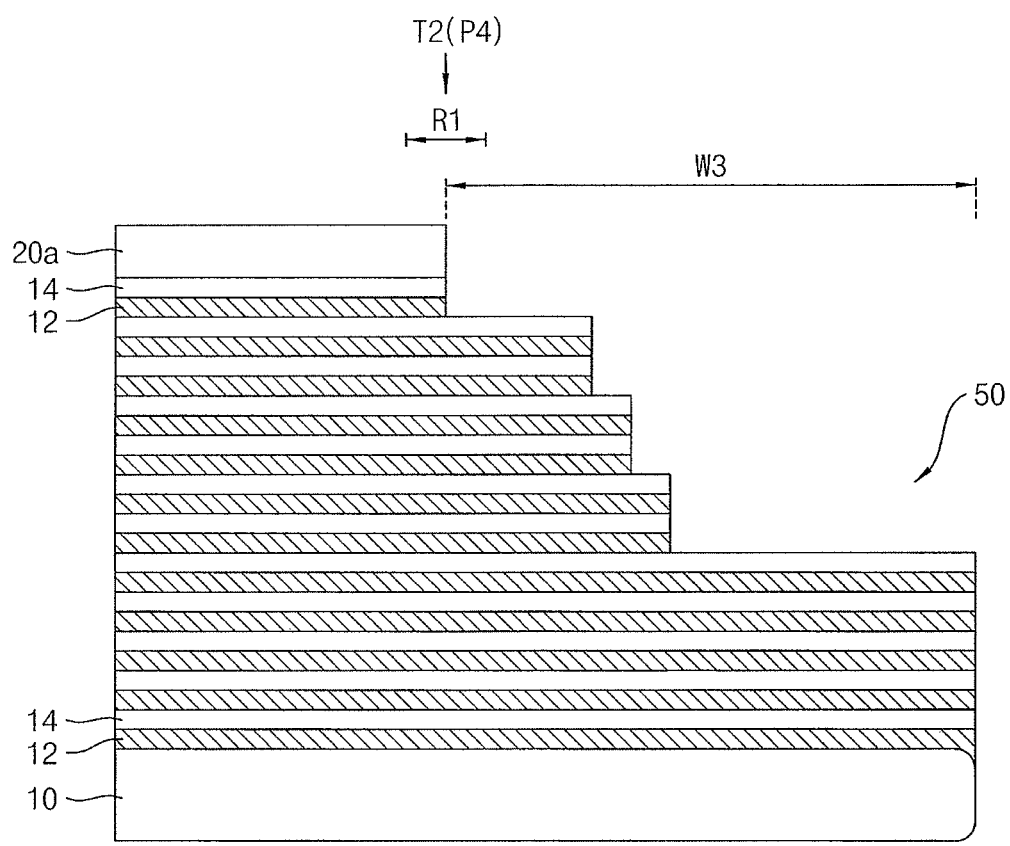
Figure 11B:
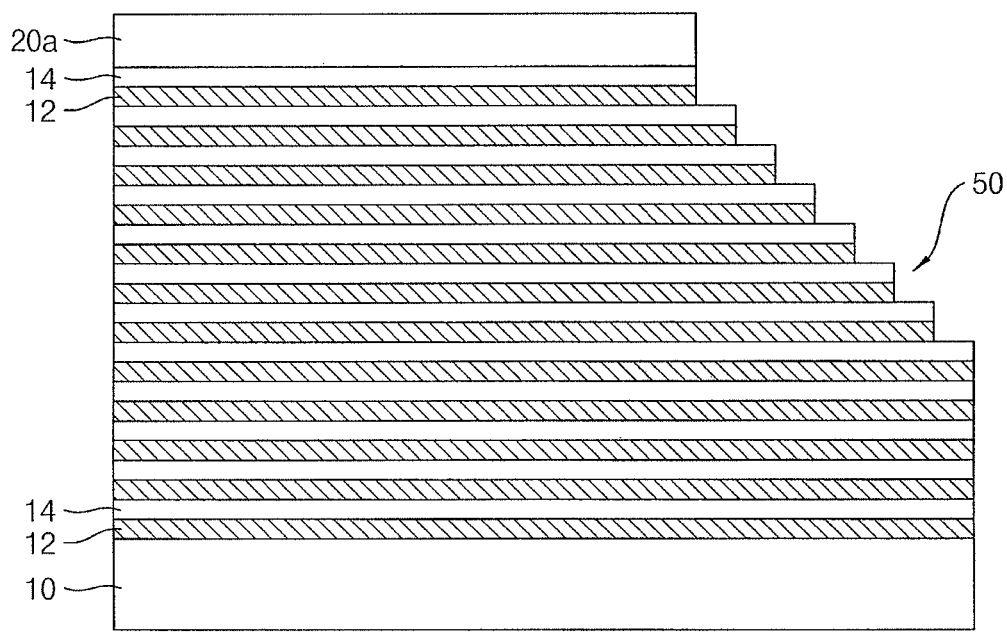

Referring to FIGS. 11A and 11B, a third photoresist film may be coated on the preliminary mold structure 50, and the third photoresist film may be exposed and developed to form a seventh photoresist pattern 20a.

In detail, the third photoresist film may be formed on the preliminary mold structure 50 on the main region and the edge region. The third photoresist film may be exposed by a first exposure process. The first exposure process may be performed to form the second mold structure on the main region of the substrate 10. Also, an EEW process may be performed to remove the third photoresist film from the edge region. The third photoresist film may be developed to form the seventh photoresist pattern 20a on the main region and the edge region.

Referring to FIG. 11A, in the EEW process, the second target position T2 of exposure, which is different from the first target position T1 of exposure, may be used. In example embodiments, the second target position T2 may be spaced apart from the boundary of the substrate 10 by the third width W3 in the first direction toward the inner portion of the substrate 10. The third width W3 may be greater than the second width W2.

In example embodiments, a difference between the second width W2 and the third width W3 may be in a range of about 0.01 mm to about 1.0 mm. In example embodiments, a difference between the second width W2 and the third width W3 may be greater than about ½ of the range R1 of the tolerance of the target position of exposure in the EEW process.

In example embodiments, a real end portion of the seventh photoresist pattern 20a may be located at a fourth position P4, and the fourth position P4 may be located in the range R1 of the tolerance from the second target position T2. For example, when the tolerance of the target position of exposure is +/−0.1 mm, the range of the tolerance of the target position of exposure may be about 0.2 mm. Thus, the fourth position P4 may be positioned in a range of +/−0.1 mm from the second target position T2.

Referring to FIG. 11A, the fourth position P4 may be exactly aligned with the second target position T2 without the tolerance. In example embodiments, the seventh photoresist pattern 20a on the edge region may be formed to expose an edge portion of an uppermost layer in the preliminary mold structure 50.

Referring to FIG. 11B, the seventh photoresist pattern 20a on the main region may be formed to form the second mold structure having a staircase shape. Exposed upper ones of the first insulation layers 14 and respective upper ones of the first sacrificial layers 12 therebeneath in the preliminary mold structure 50 may be etched using the seventh photoresist pattern 20a as an etching mask.

That is, in the EEW processes for forming the first mold structure, at least two target positions may be used. Thus, the end portions of the photoresist patterns formed by the EEW processes may be located at different positions, so that a step structure of the first mold structure may have a gentle slope, e.g., as compared to a steep slope of a step structure formed by a single target position.

Figure 12A:
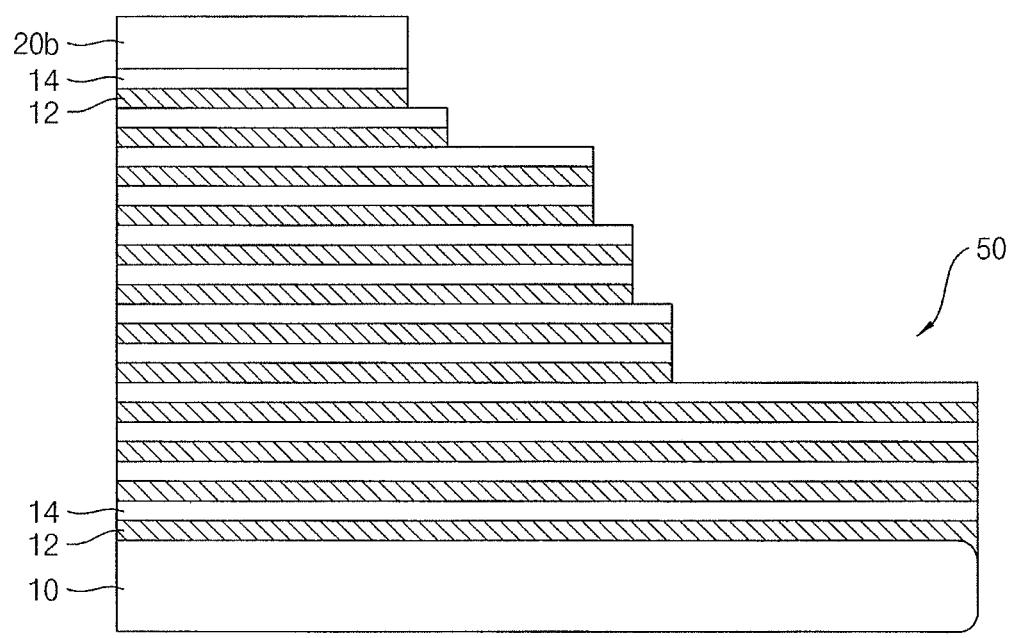
Figure 12B:
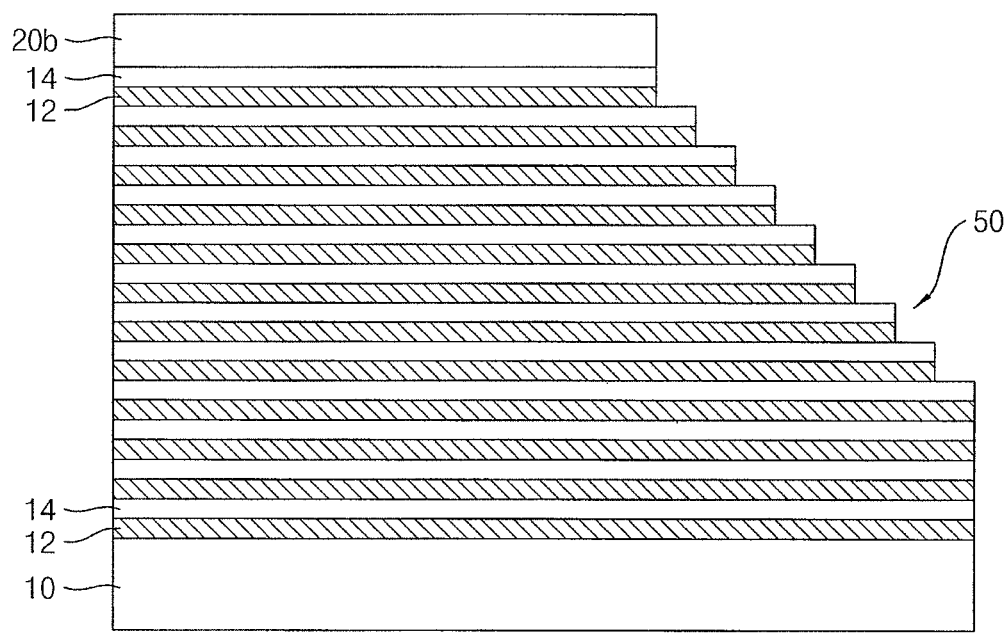

Referring to FIGS. 12A and 12B, an eighth photoresist pattern 20b may be formed by a trimming process of the seventh photoresist pattern 20a. Exposed upper ones of the first insulation layers 14 and upper ones of the first sacrificial layers 12 therebeneath in the preliminary mold structure 50 may be etched using the eighth photoresist pattern 20b as an etching mask.

Figure 13A:
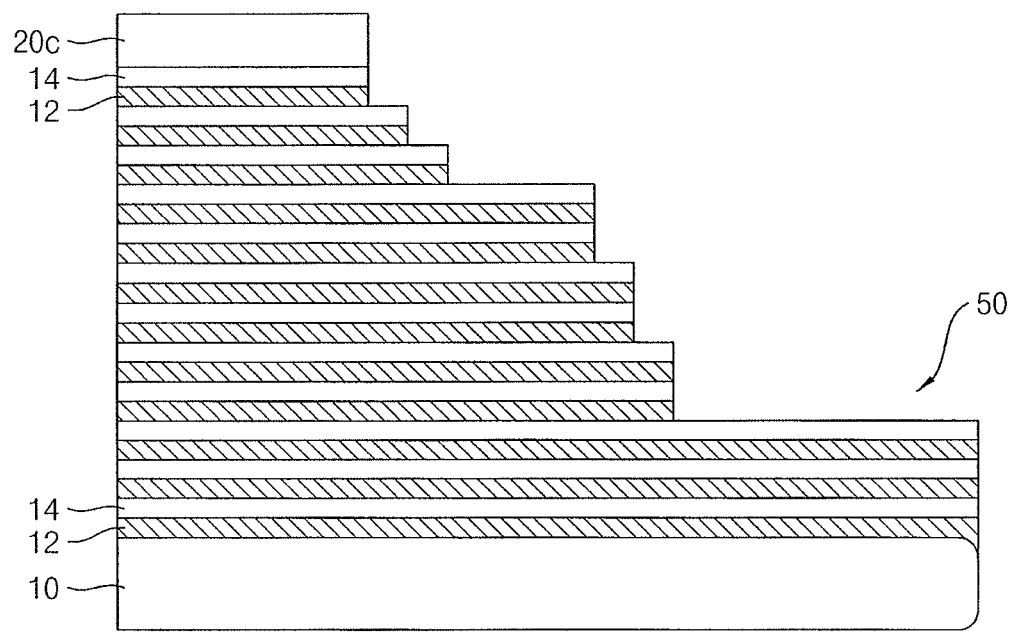
Figure 13B:
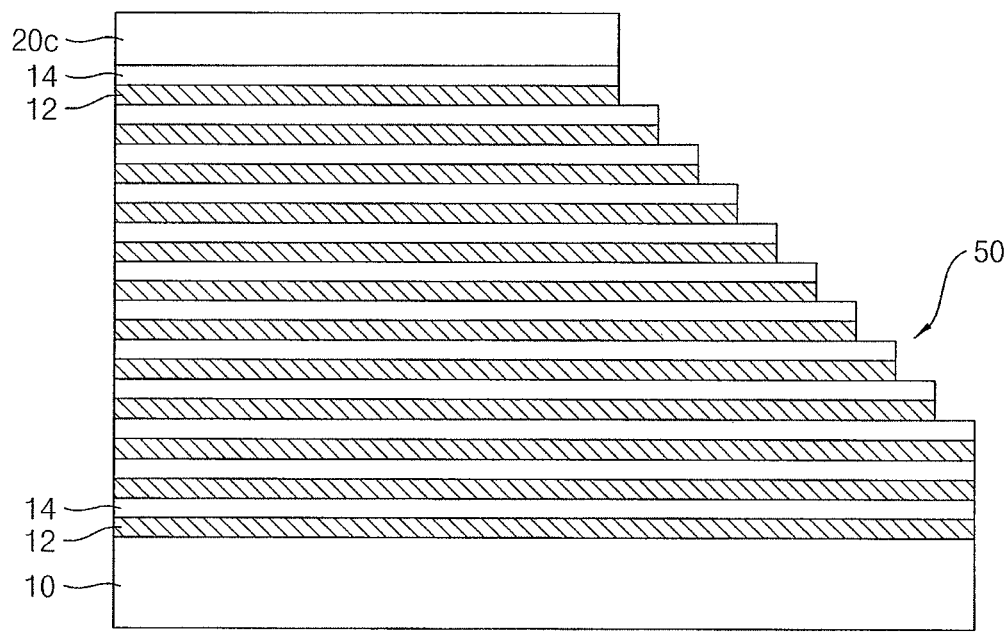

Referring to FIGS. 13A and 13B, a ninth photoresist pattern 20c may be formed by a trimming process of the eighth photoresist pattern 20b. Exposed upper ones of the first insulation layers 14 and respective upper ones of the first sacrificial layers 12 therebeneath in the preliminary mold structure 50 may be etched using the ninth photoresist pattern 20c as an etching mask.

Figure 14A:
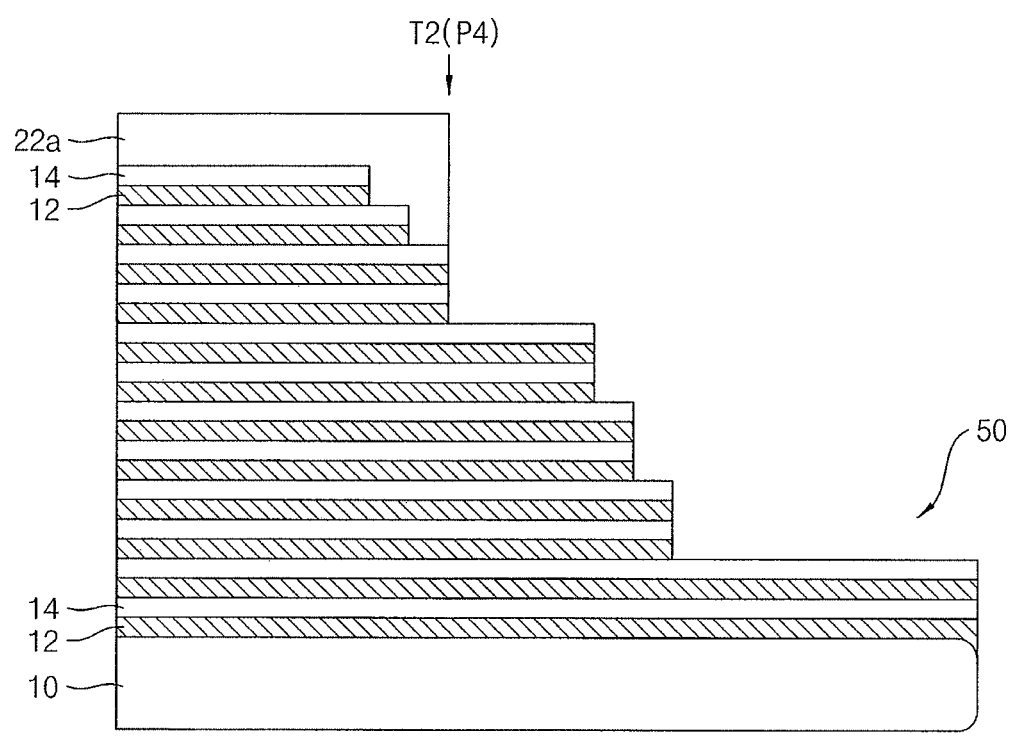
Figure 14B:
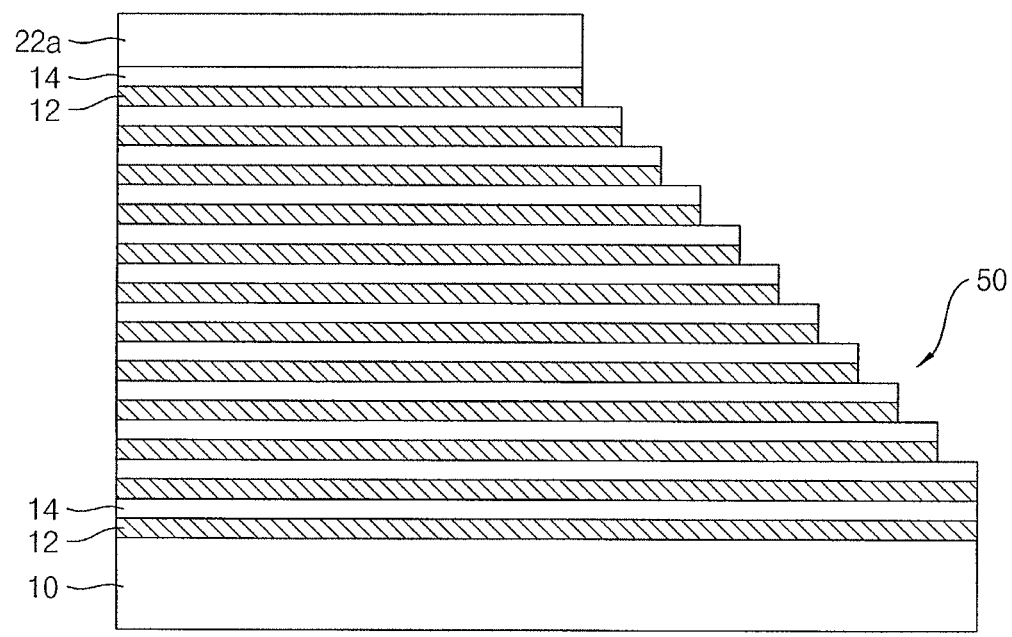

Referring to FIGS. 14A and 14B, a fourth photoresist film may be coated on the preliminary mold structure 50, and the fourth photoresist film may be exposed and developed to form a tenth photoresist pattern 22a.

In detail, the fourth photoresist film may be formed on the preliminary mold structure 50 on the main region and the edge region. The fourth photoresist film may be exposed by a first exposure process. The first exposure process may be performed to form the second mold structure on the main region of the substrate 10. Also, an EEW process may be performed to remove the fourth photoresist film on the edge region. The fourth photoresist film may be developed to form the tenth photoresist pattern 22a on the main region and the edge region.

Referring to FIG. 14A, in the EEW process, the second target position T2 of exposure may be used. In example embodiments, when the second target position T2 is exactly aligned with the fourth position P4 without a tolerance, an end portion of the tenth photoresist pattern 22a may be positioned at the fourth position P4 substantially the same as the second target position T2. That is, end portions of the seventh photoresist pattern 20a and the tenth photoresist pattern 22a may be placed at the same position.

Alternatively, the second target position T2 may not be aligned with the fourth position P4 because of the tolerance. In this case, end portions of the seventh photoresist pattern 20a and the tenth photoresist pattern 22a may be located at different positions from each other. That is, the end portion of the tenth photoresist pattern 22a may be located in the range of the tolerance from the second target position T2, and thus, a shape of the step structure of the preliminary mold structure 50 may be changed.

Referring to FIG. 14B, the tenth photoresist pattern 22a on the main region may be formed to form the second mold structure having a staircase shape. Exposed upper ones of the first insulation layers 14 and respective upper ones of the first sacrificial layers 12 therebeneath in the preliminary mold structure 50 may be etched using the tenth photoresist pattern 22a as an etching mask.

Figure 15A:
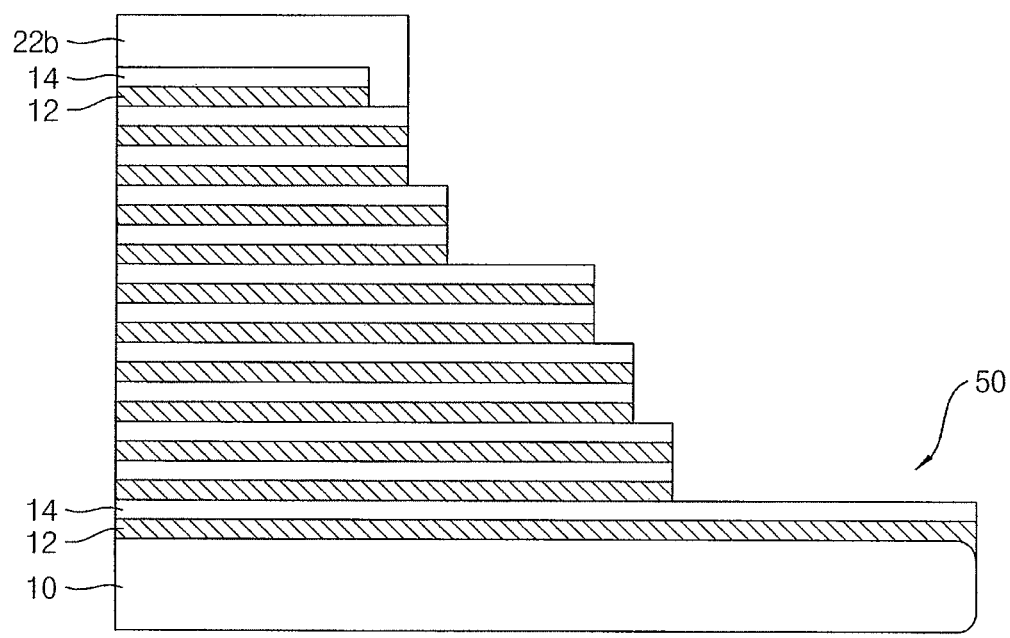
Figure 15B:
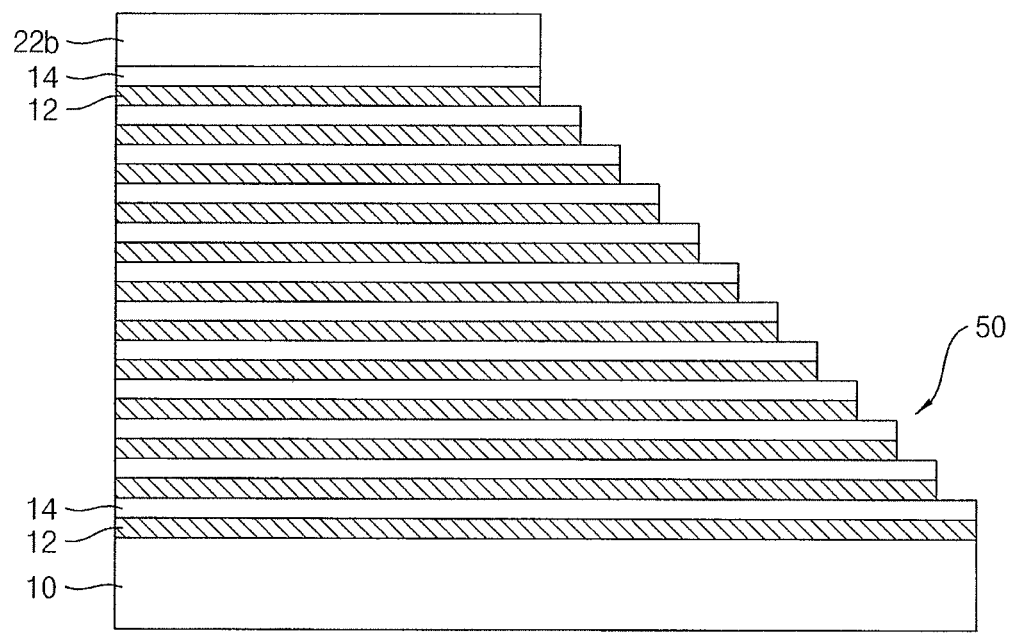

Referring to FIGS. 15A and 15B, an eleventh photoresist pattern 22b may be formed by a trimming process of the tenth photoresist pattern 22a. Exposed upper ones of the first insulation layers 14 and respective upper ones of the first sacrificial layers 12 therebeneath in the preliminary mold structure 50 may be etched using the eleventh photoresist pattern 22b as an etching mask.

Figure 16A:
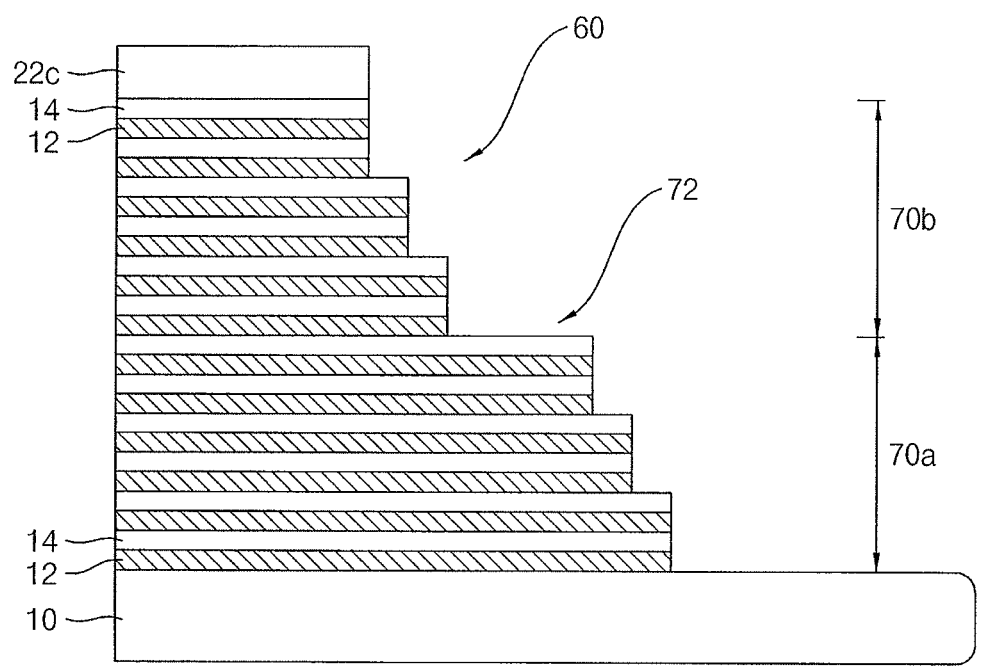
Figure 16B:
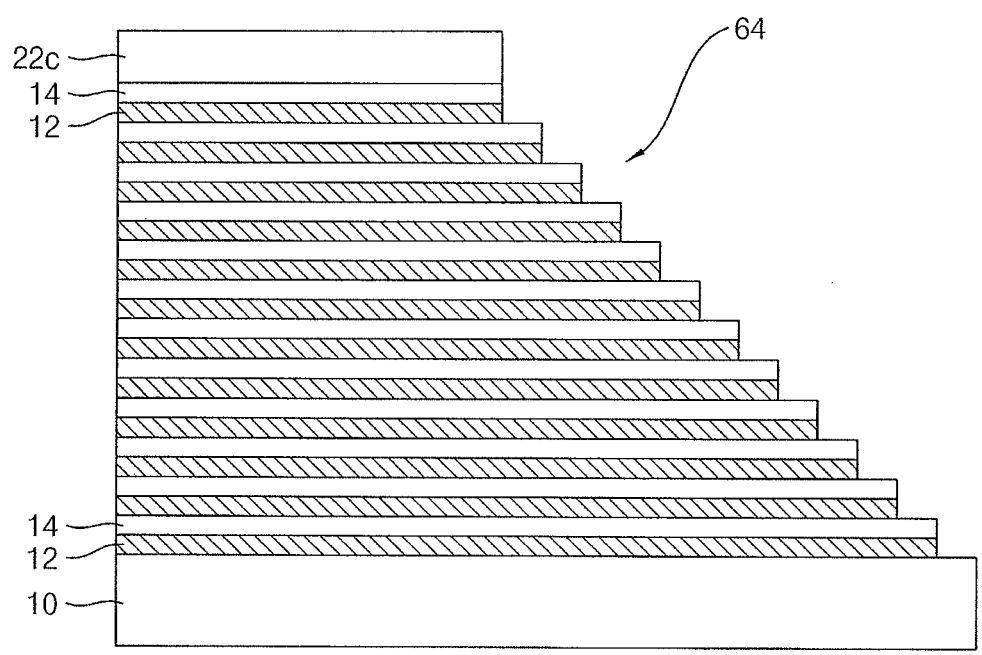

Referring to FIGS. 16A and 16B, a twelfth photoresist pattern 22c may be formed by a trimming process of the eleventh photoresist pattern 22b. Exposed upper ones of the first insulation layers 14 and respective upper ones of the first sacrificial layers 12 therebeneath in the preliminary mold structure 50 may be etched using the twelfth photoresist pattern 22c as an etching mask. Thus, the second mold structure 64 may be formed on the main region, and the first mold structure 60 may be formed on the edge region.

Referring to FIG. 16A, the first sidewall adjacent to the bevel region of the first mold structure 60 may include the first step portion 70a and the second step portion 70b above the first step portion 70a. The first step portion 70a may be formed by the EEW process using the first target position T1 of exposure. The second step portion 70b may be formed by the EEW process using the second target position T2 of exposure.

In example embodiments, the step layer 72 may be formed between the first and second step portions 70a and 70b, so that the first and second step portions 70a and 70b may be distinguished from each other by the step layer 72. In example embodiments, an upper surface of the step layer 72 may have a width in the first direction greater than a width in the first direction of an upper surface of each step of the first and second step portions 70a and 70b, e.g., the width of an exposed upper surface of the step layer 72 may correspond to a difference between the second and third widths W2 and W3.

The EEW processes may be performed using at least two of the target positions of exposures, respectively, so that a step structure of the first sidewall of the first mold structure 60 have a gentle slope. That is, performing the EEW processes with at least two different target positions of exposures, e.g., at least two different target positions with an increasing distance relative to an outermost edge of the substrate 10, provides a step structure that has a gentler slope, e.g., a milder overall incline measured from an outermost edge of a lowermost step in the first step portion 70a to an outermost edge of an uppermost step in the second step portion 70b, as compared to a step structure formed by a single target position.

Figure 17A:
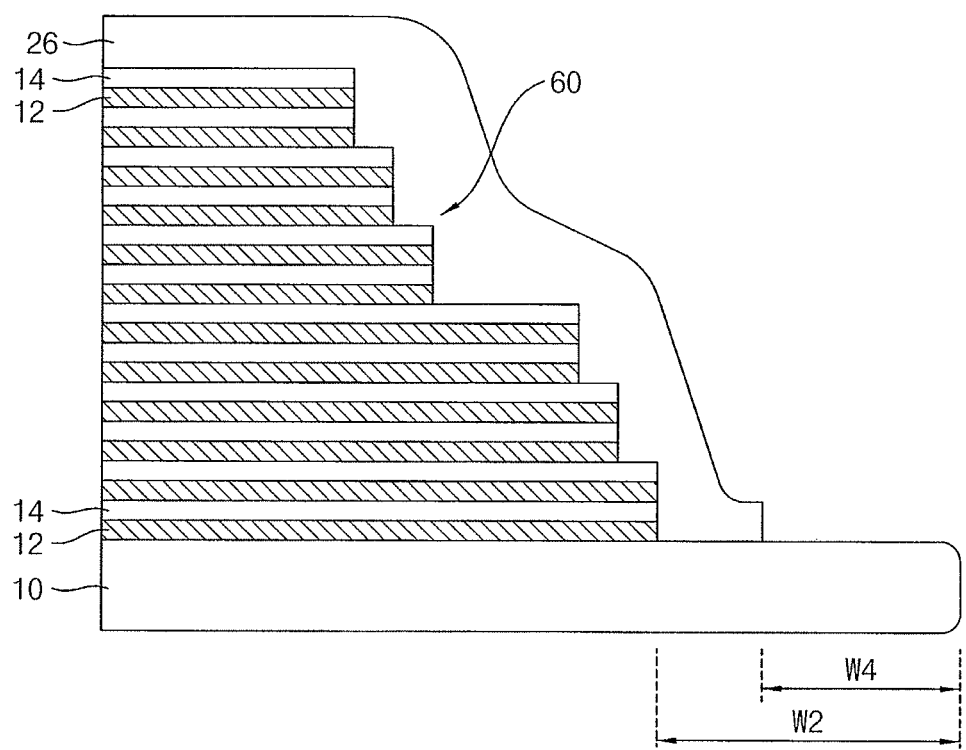
Figure 17B:
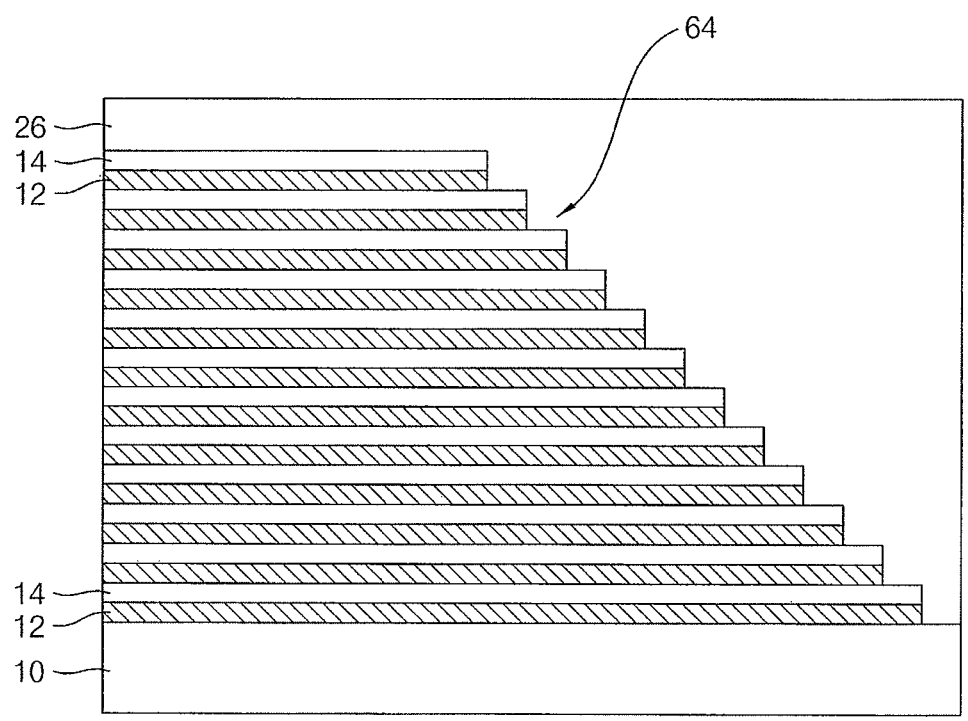

Referring to FIGS. 17A and 17B, the insulating interlayer 26 may be formed on the first and second mold structures 60 and 64. The insulating interlayer 26 may be formed along the first sidewall of the first mold structure 60 on the edge region.

In example embodiments, an upper surface of the insulating interlayer 26 on the main region may be planarized. The insulating interlayer 26 on the bevel region may be partially removed to expose a surface of the bevel region. An end portion of the insulating interlayer 26 may be located at a position spaced apart from the boundary of the substrate 10 by the fourth width W4 in the first direction toward the inner portion of the substrate 10. The fourth width W4 may be less than the second width W2. The insulating interlayer 26 may cover the first and second mold structures 60 and 64.

Figure 18A:
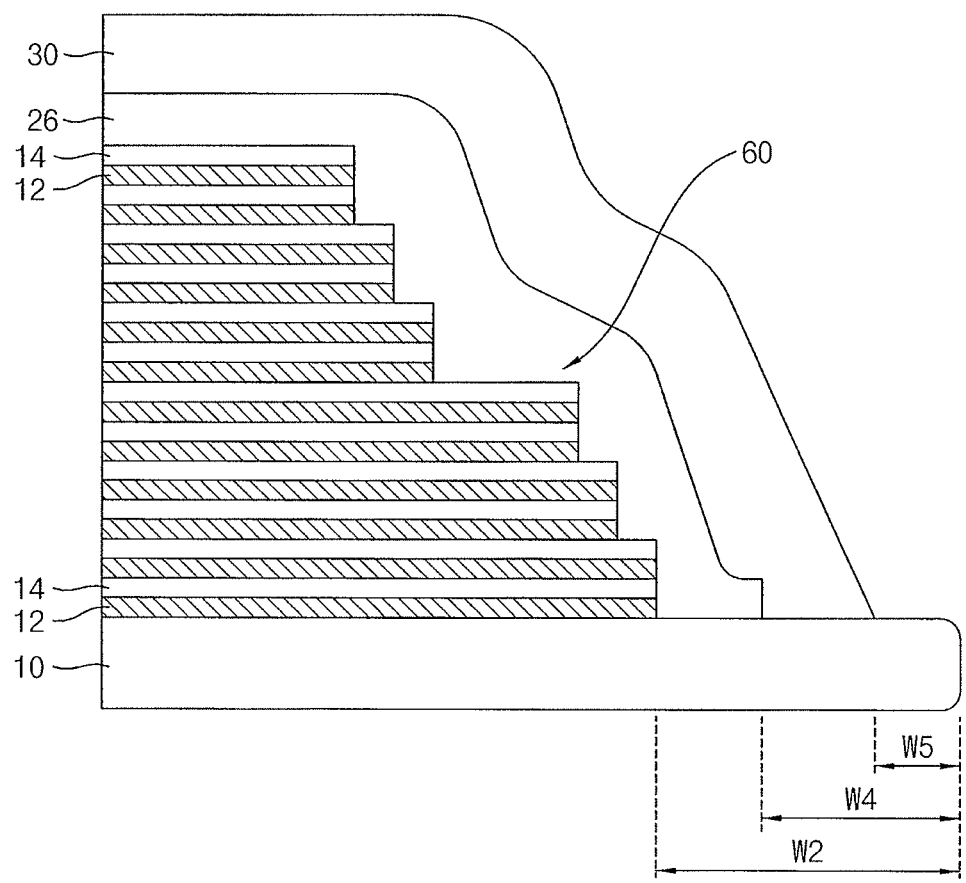
Figure 18B:
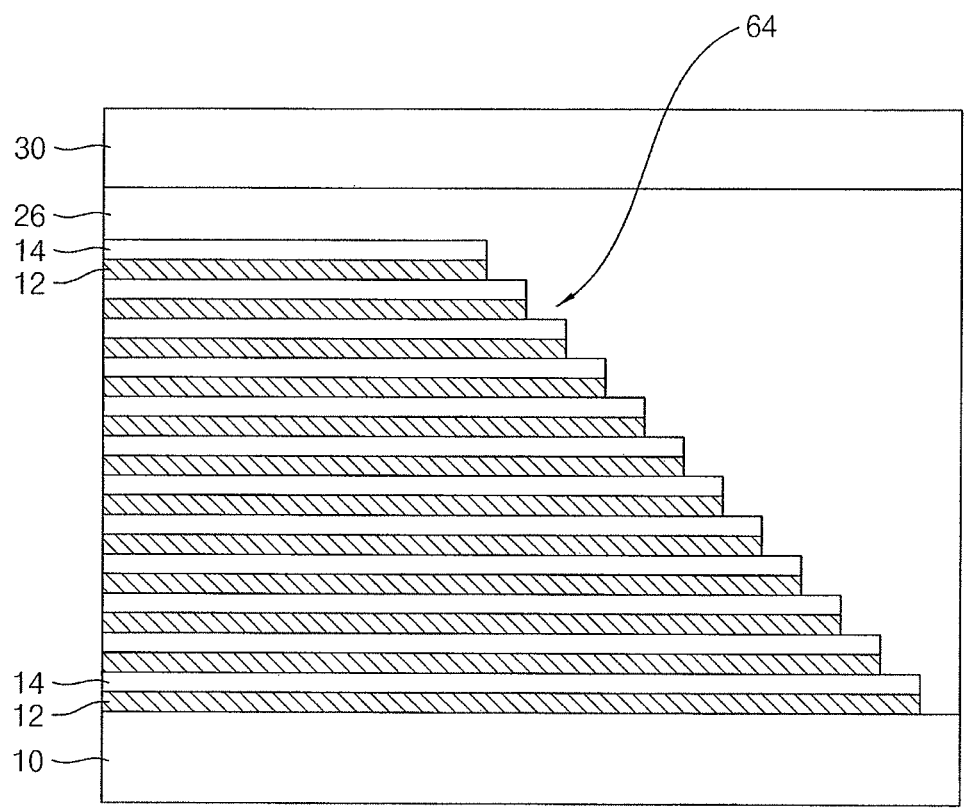

Referring to FIGS. 18A and 18B, a hard mask layer 30 may be formed on the insulating interlayer 26 and the surface of the bevel region. The hard mask layer 30 on the bevel region may be partially removed to expose the bevel region of the substrate 10. An end portion of the hard mask layer 30 may be located at a position spaced apart from the boundary of the substrate 10 by a fifth width W5 in the first direction toward the inner portion of the substrate 10. The fifth width W5 may be less than the fourth width W4. Thus, an edge portion of the hard mask layer 30 may directly contact the surface of the substrate 10.

In example embodiments, the hard mask layer 30 may include amorphous carbon. The hard mask layer 30 may include a conductive material. The hard mask layer 30 may be formed by a CVD process.

The hard mask layer 30 may serve as an etching mask for etching the second mold structure 64 by a subsequent etching process. Thus, as heights of the first and second mold structures 60 and 64 increase, a thickness of the hard mask layer 30 may be greater. In example embodiments, the hard mask layer 30 may have a thickness of about 0.5 μm to about 5 μm.

The hard mask layer 30 may contact the bevel region of the substrate 10, so that the hard mask layer 30 and the substrate 10 may be electrically connected to each other. Thus, when the subsequent etching process is performed, a voltage may not be generated between the hard mask layer 30 and the substrate 10.

The first sidewall of the first mold structure 60 may have a gentle slope. Thus, although the hard mask layer 30 is formed by a process having a poor step coverage characteristic, the hard mask layer 30 on the first sidewall of the first mold structure 60 may have uniform thickness. Also, failures, e.g., that the hard mask layer 30 is not formed or is formed to have a thin thickness on the first sidewall of the first mold structure 60, may not be generated.

If the hard mask layer 30 is not formed or is formed to have a thin thickness on the first sidewall of the first mold structure 60, e.g., when a first sidewall of a mold structure does not have a gentle slope, a disconnected portion between the hard mask layer 30 and the substrate 10 may be formed. Thus, when a subsequent etching process is performed, a voltage may be generated between the hard mask layer 30 and the substrate 10, so that an arcing may be generated. Damages and particles of the substrate 10 may be generated due to the arcing, and thus failures may be generated in the vertical memory device on the substrate 10.

Figure 19A:
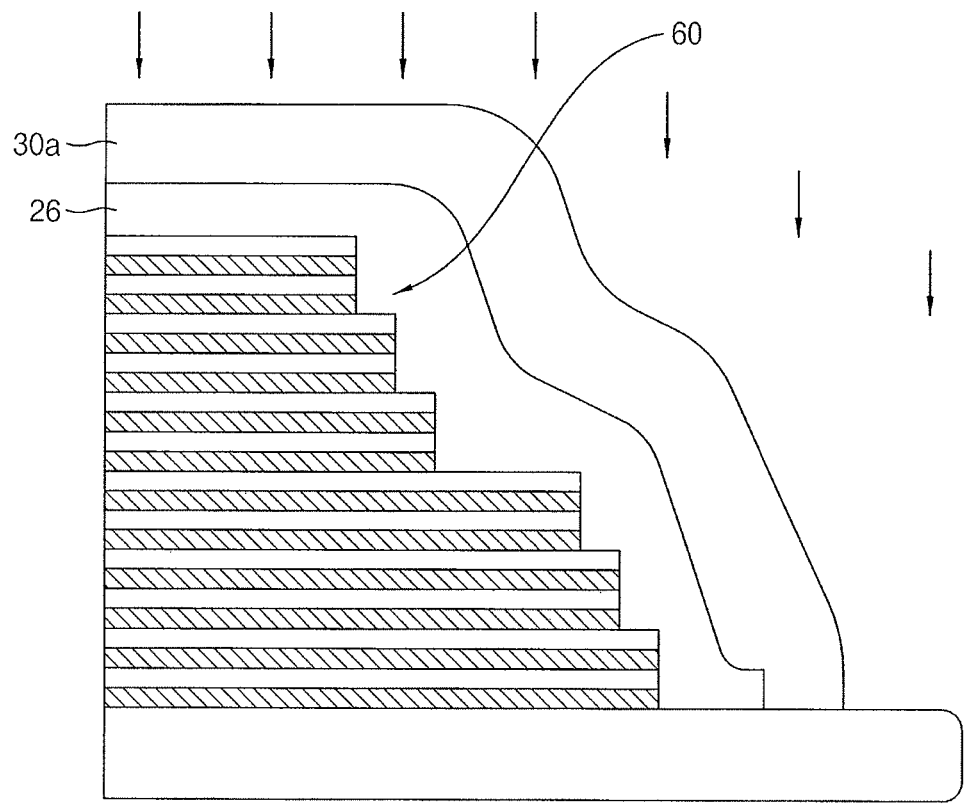
Figure 19B:
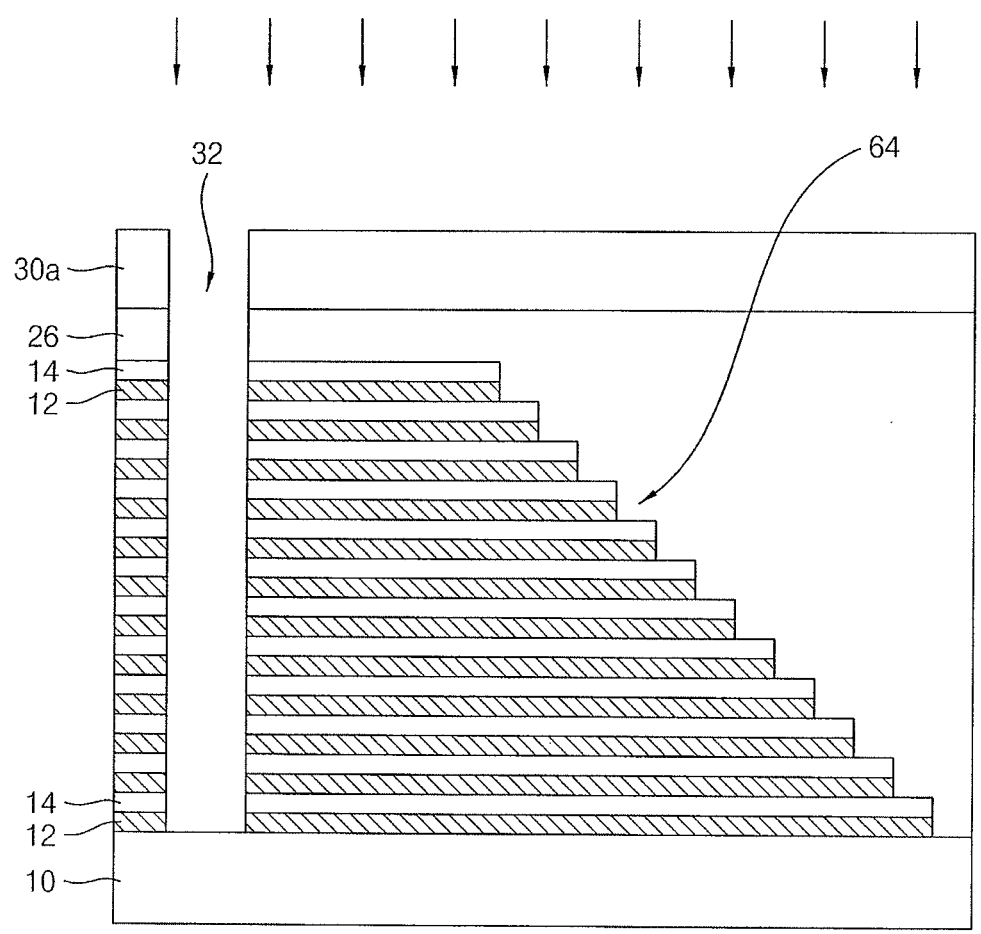

Referring to FIGS. 19A and 19B, the hard mask layer 30 may be patterned by a photolithograph process to form a hard mask 30a. The hard mask 30a may include a hole therein. The second mold structure 64 may be etched using the hard mask 30a as an etching mask to form the channel hole 32 exposing an upper surface of the substrate 10. In example embodiments, a plurality of channel holes 32 may be formed.

In example embodiments, the channel hole 32 may be formed through the second mold structure 64. That is, an actual vertical memory device may not be formed on the edge region of the substrate 10, so that the channel hole 32 may not be formed at the first mold structure 60.

Alternatively, the channel hole 32 may be formed through the first and second mold structures 60 and 64. That is, the channel hole 32 may be also formed through the first mold structure 60. In example embodiments, an arrangement of the channel holes 32 in the first mold structure 60 may be different from an arrangement of the channel holes 32 in the second mold structure 64. For example, a distance between the channel holes 32 in the first mold structure 60 may be greater than a distance between the channel holes 32 in the second mold structure 64.

The first and second mold structures 60 and 64 may include the first sacrificial layers 12 and the first insulation layers 14 alternately and repeatedly stacked. As the number of the first sacrificial layers 12 and the first insulation layer 14 increases, a thickness of each of the first and second mold structures 60 and 64 may increase. In example embodiments, each of the first and second mold structures 60 and 64 may have a thickness of about 1 μm to about 10 μm.

When the second mold structure 64 having the thickness of, e.g., about 1 μm to about 10 μm, is etched to form the channel hole 32, a high power may be used in the etching process. Also, a high voltage may be supplied to a bottom of the substrate 10.

During the etching process, the hard mask 30a and the substrate 10 of the bevel region may contact to each other. The hard mask 30a may be formed on the first sidewall of the first mold structure 60 having a uniform thickness. Thus, a voltage may not be generated between the hard mask 30a and the bottom of substrate 10, so that an arcing may not be generated.

After forming the channel hole 32, the hard mask 30a may be removed. Then, processes for manufacturing the vertical memory device on the main region may be performed. Hereinafter, a process for manufacturing the vertical memory device in accordance with an example embodiment may be described, but may not be limited to the below-illustrated one.

Figure 20:
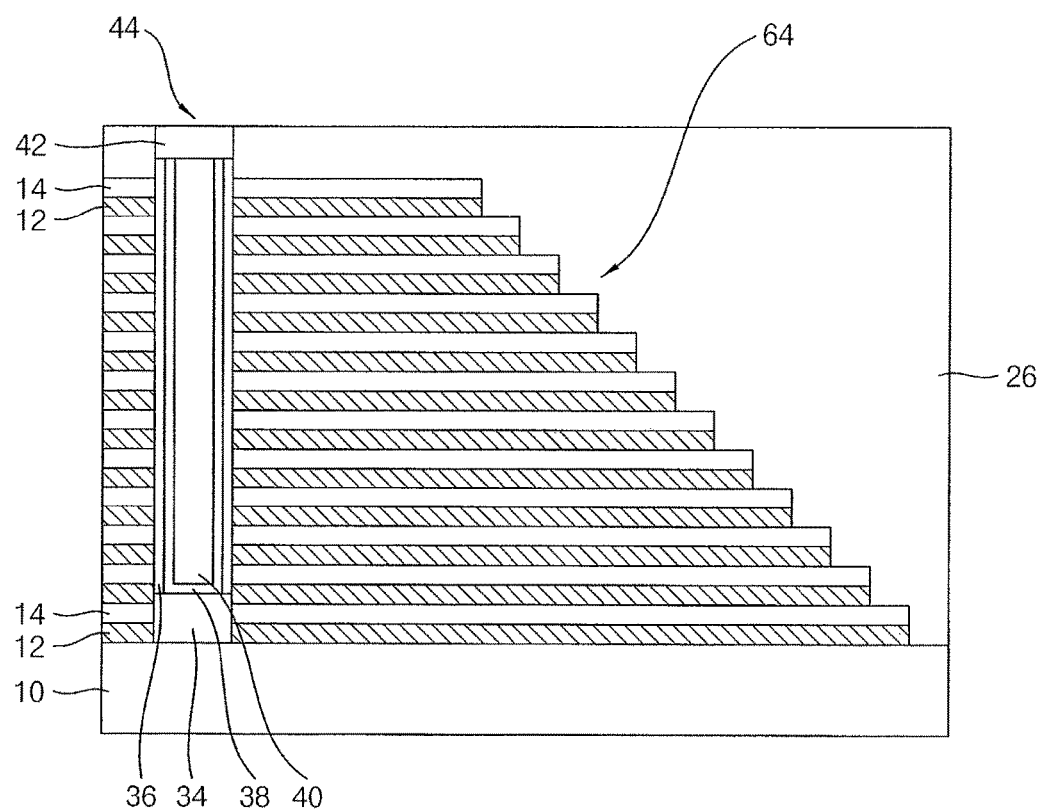

Referring to FIG. 20, the vertical channel structure 44 may be formed to fill the channel hole 32. The vertical channel structure 44 may be formed to include the channel 38, the charge storage structure 36 including a tunnel insulation layer, a charge storage layer, and a blocking dielectric layer, and the filling insulation pattern 40. In example embodiments, the semiconductor pattern 34 may be formed between the upper surface of the substrate 10 exposed by the channel hole 32 and the vertical channel structure 44.

In example embodiments, the semiconductor pattern 34 may be formed in a lower portion of the channel hole 32. For example, the semiconductor pattern 34 may be formed by a selective epitaxial growth (SEG) process using the upper surface of the substrate 10 exposed by the channel hole 32 as a seed. Alternatively, an amorphous silicon layer filling the lower portion of the channel hole 32 may be formed, and a laser epitaxial growth (LEG) process or a solid phase epitaxy (SPE) process may be performed thereon to form the semiconductor pattern 34.

The blocking dielectric layer, the charge storage layer, and the tunnel insulation layer may be sequentially formed on a sidewall of the channel hole 32, and upper surfaces of the semiconductor pattern 34 and the insulating interlayer 26. The blocking dielectric layer, the charge storage layer, and the tunnel insulation layer may be etched back to form the charge storage structure 36 including the blocking dielectric layer, the charge storage layer, and the tunnel insulation layer.

A channel layer may be formed on the tunnel insulation layer, the semiconductor pattern 34, and the insulating interlayer 26, and a filling insulation layer may be formed to fill a remaining portion of the channel hole 32. Upper surfaces of the channel layer and the filling insulation layer may be planarized until the upper surface of the insulating interlayer 26 may be exposed to form the channel 38 and the filling insulation pattern 40. Thus, the vertical channel structure 44 may be formed on the semiconductor pattern 34. The blocking dielectric layer, the charge storage layer, and the tunnel insulation layer may be formed by a CVD process, a PE-CVD process and an ALD process.

In example embodiments, the channel layer may be formed of doped polysilicon or amorphous silicon. Alternatively, the channel layer may be formed of polysilicon or amorphous silicon, and then a heat treatment or a laser beam irradiation may be further performed on the channel layer. In this case, the channel layer may include single crystalline silicon. The filling insulation layer may be formed of, e.g., silicon oxide or silicon nitride. The channel layer and the filling insulation layer may be formed by a CVD process, a PECVD process, an ALD process, a PVD process, a sputtering process, etc. In example embodiments, the formation of the filling insulation layer may be omitted, and the channel 38 may have a pillar shape filling the channel hole 32.

The pad pattern 42 may be formed in an upper portion of the channel hole 32. In example embodiments, an upper portion of the vertical channel structure 44 may be partially removed by, e.g., an etch-back process to form a recess, and the pad pattern 42 may be formed to fill the recess. The pad pattern 42 may be formed of, e.g., polysilicon.

Figure 21A:
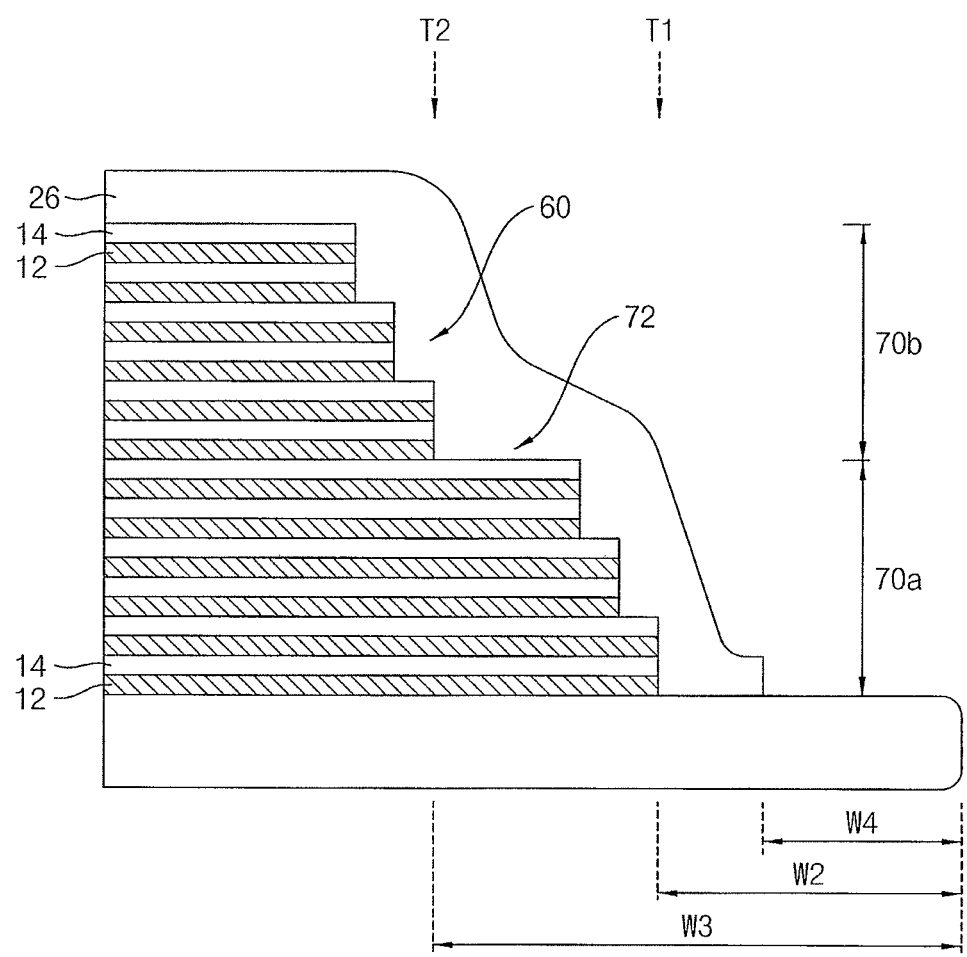
Figure 21B:
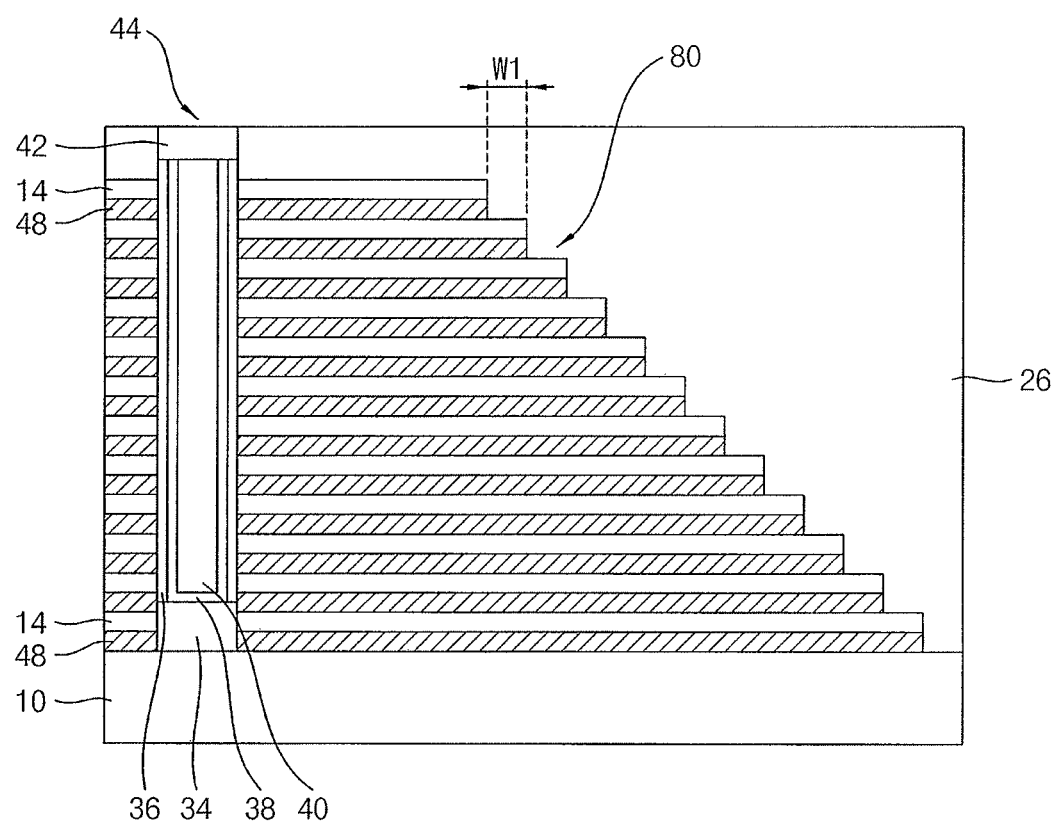

Referring to FIGS. 21A and 21B, the first sacrificial layer 12 of the second mold structure 64 may be replaced with a conductive pattern to form the gate 48. In detail, the insulating interlayer 26 and the first and second mold structures 60 and 64 may be etched to form an opening exposing an upper surface of the substrate 10. The first sacrificial layer 12 may be removed through the opening to form a gap. A conductive material may fill the gap, so that the conductive pattern may be formed.

In example embodiments, the first sacrificial layer 12 of the second mold structure 64 may be completely removed, and may be replaced with the conductive pattern. The conductive pattern may serve as the gate 48. Thus, a conductive pattern structure 80 including the gates 48 and the first insulation layers 14 alternately and repeatedly stacked may be formed on the main region of the substrate 10.

However, the first mold structure 60 may not be transformed into an actual vertical memory device, so that the first sacrificial layer 12 may not be replaced with the conductive pattern. That is, the first sacrificial layer 12 may remain on the edge region of the substrate 10. Alternatively, some or all of the first sacrificial layers 12 of the first mold structure 60 may be replaced with the conductive pattern.

The conductive material may include a metal, e.g., tungsten, aluminum, copper, titanium or tantalum, or a nitride of the above metal. In example embodiments, the conductive material may include tungsten.

An impurity region may be formed at an upper portion of the substrate 10 exposed by the opening. An insulation pattern may be formed on the impurity region to fill the opening. A plurality of contact plugs contacting an edge portion of the gates 48 may be formed through the insulating interlayer 26.

In example embodiments, an insulation pattern may be formed on a sidewall of the opening. A conductive material may fill the opening, so that a common source line (CSL) may be formed on the impurity region.

A bit line may be formed on the pad pattern 42, and may be electrically connected with the pad pattern 42. A wiring line may be formed on the contact plugs, and may be electrically connected with the contact plugs.

As described above, in the etching process for forming the channel hole, the arcing may be decreased. Thus, failures of the vertical memory device may decrease.

FIGS. 22 to 28 are cross-sectional views illustrating stages of a method of manufacturing a vertical memory device in accordance with example embodiments. The method of manufacturing the vertical memory device may include same or similar processes to those illustrated with reference to FIGS. 5A to 21B. In example embodiments, the shape of the step structure of the first mold structure may be variously changed according to the tolerance of the target position of exposure.

First, processes substantially the same as or similar to those illustrated with reference to FIGS. 4A to 7B are performed.

Figure 22:
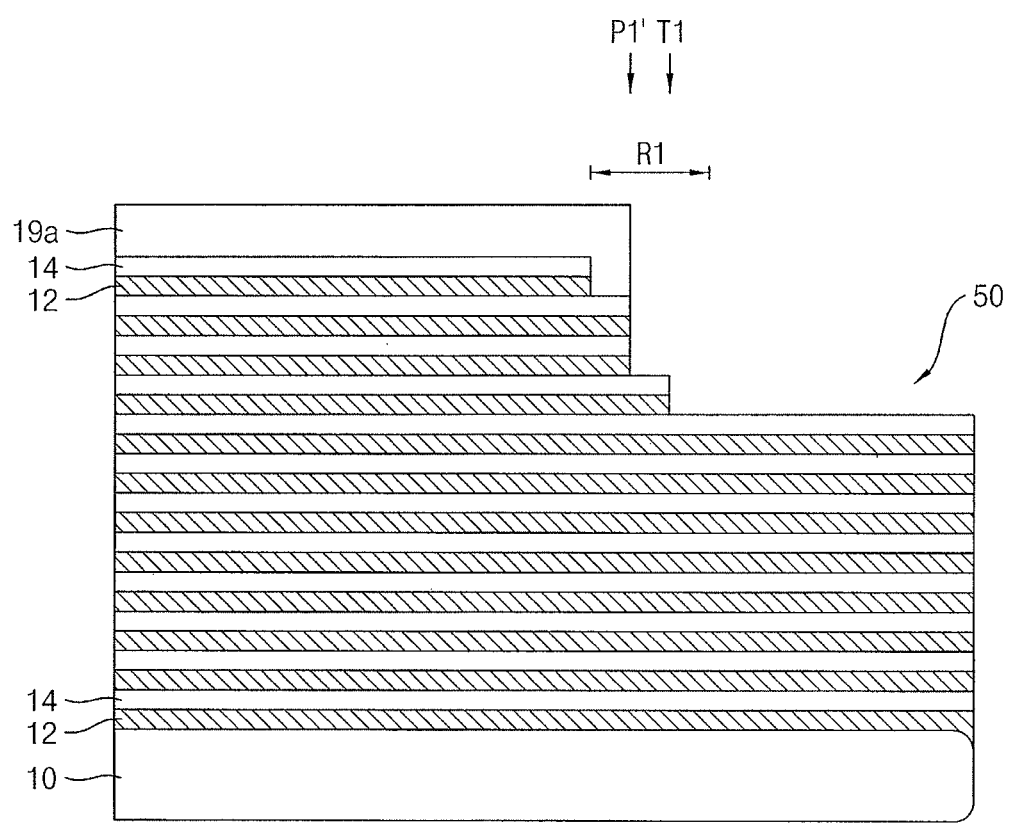
FIGS. 22 to 28 illustrate cross-sectional views of stages in a method of manufacturing a vertical memory device in accordance with example embodiments.

Next, referring to FIG. 22, a second photoresist film may be coated on the preliminary mold structure 50, and the second photoresist film may be exposed and developed to form a fourth photoresist pattern 19a. In an EEW process, the first target position T1 of exposure may be used.

In example embodiments, when the first target position T1 is aligned with a tolerance, an end portion of the fourth photoresist pattern 19a may be located at a first position P1' different from the first target position T1. That is, an end portion of the fourth photoresist pattern 19a may be different from an end portion of the first photoresist pattern 16a. The first position P1' may be located in the range R1 of the tolerance from the first target position T1.

Exposed upper ones of the first insulation layers 14 and respective upper ones of the first sacrificial layers 12 thereneath in the preliminary mold structure 50 may be etched using the fourth photoresist pattern 19a as an etching mask. Thus, a portion of a step structure may be formed at a sidewall of the preliminary mold structure 50 on the main region and the edge region.

The fourth photoresist pattern 19a may have a shape different from a shape of the fourth photoresist pattern 18a shown in FIG. 8A, due to the tolerance in the EEW process. Thus, a step structure of the preliminary mold structure 50 may have a shape different from a shape of the step structure of the preliminary mold structure 50 shown in FIG. 8A.

Figure 23:
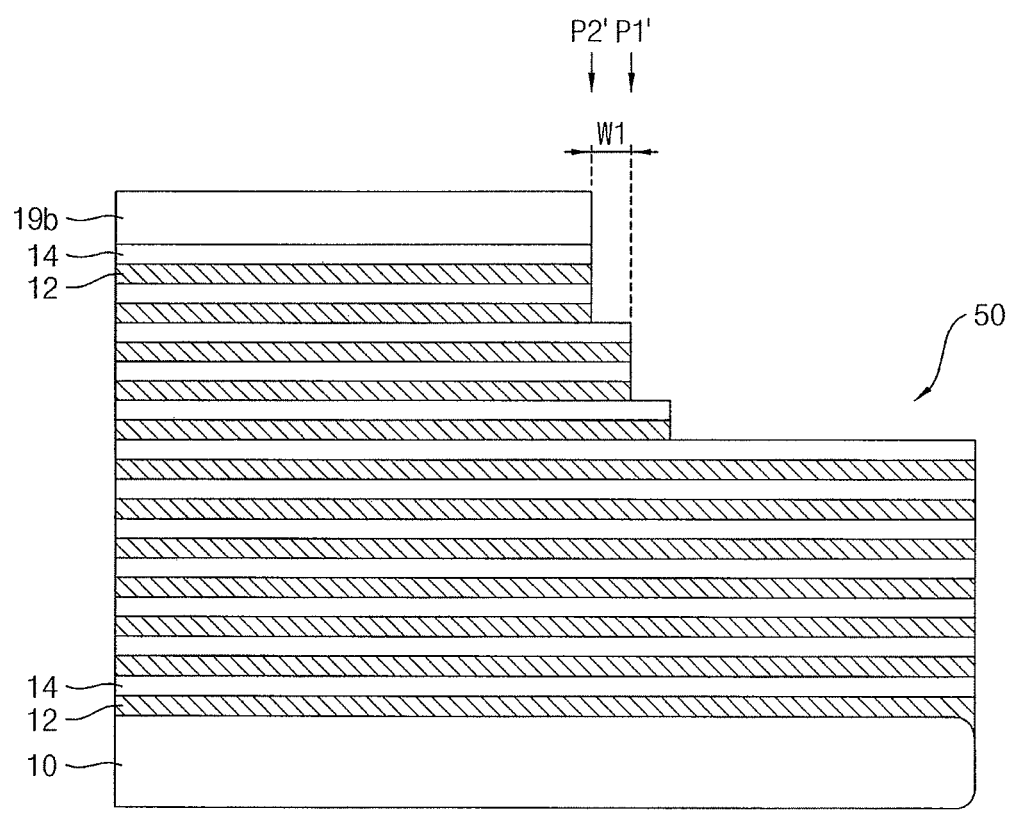

Referring to FIG. 23, a fifth photoresist pattern 19b may be formed by a trimming process of the fourth photoresist pattern 19a. Exposed upper ones of the first insulation layers 14 and respective upper ones of the first sacrificial layers 12 therebeneath in the preliminary mold structure 50 may be etched using the fifth photoresist pattern 19b as an etching mask.

Figure 24:
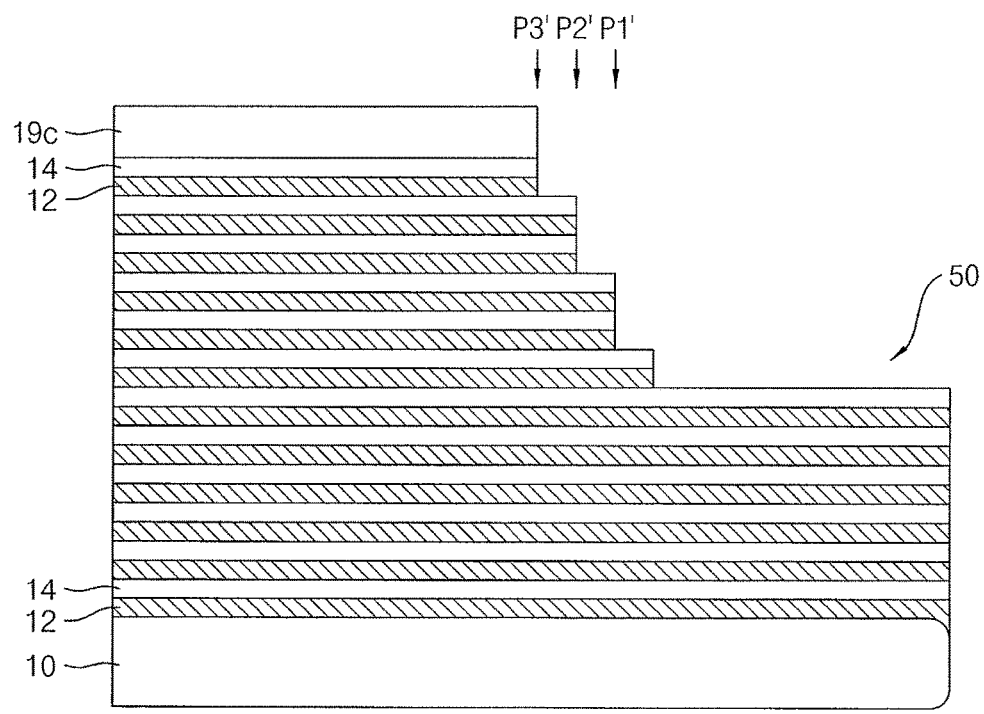

Referring to FIG. 24, a sixth photoresist pattern 19c may be formed by a trimming process of the fifth photoresist pattern 19b. Exposed upper ones of the first insulation layers 14 and respective upper ones of the first sacrificial layers 12 therebeneath in the preliminary mold structure 50 may be etched using the sixth photoresist pattern 19c as an etching mask. Thus, a first step layer of the first mold structure 60 may be formed on the edge region.

Figure 25:
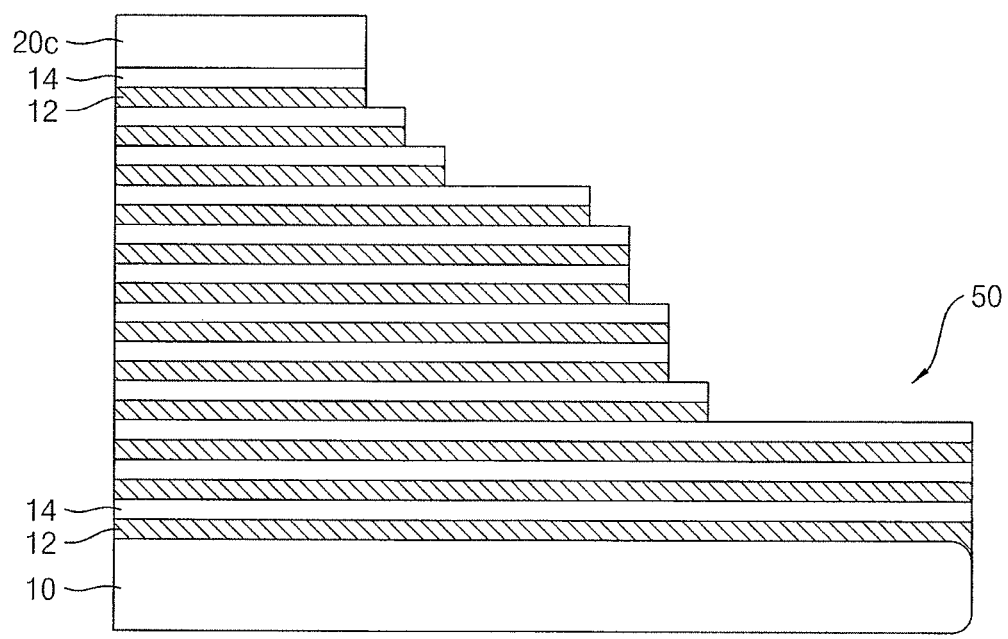

Referring to FIG. 25, processes substantially the same as or similar to those illustrated with reference to FIGS. 11A to 13B are performed. That is, in the EEW process, the second target position T2 of exposure may be used. Thus, as shown in FIG. 25, a structure may be formed on the edge region.

Figure 26:
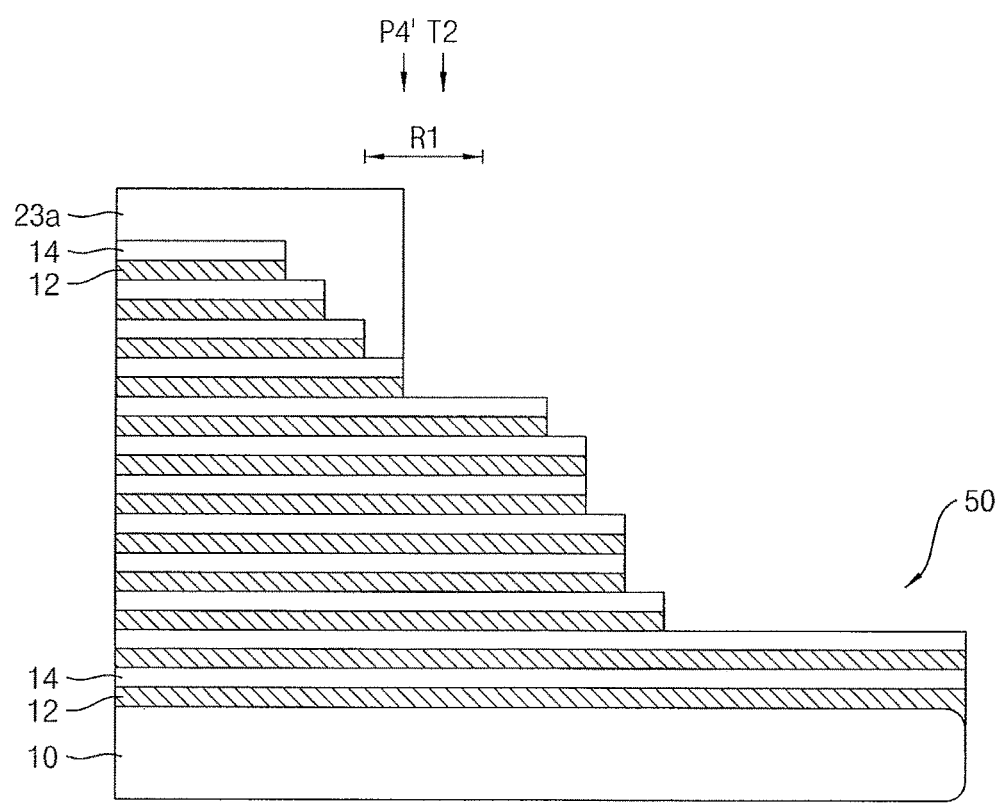

Referring to FIG. 26, a fourth photoresist film may be coated on the preliminary mold structure 50, and the fourth photoresist film may be exposed and developed to form a tenth photoresist pattern 23a. In the EEW process, the second target position T2 of exposure may be used.

In example embodiments, the second target position T2 may be aligned with a tolerance, so that an end portion of the tenth photoresist pattern 23a may be located at a fourth position P4' different from the first target position T2. That is, an end portion of the tenth photoresist pattern 23a may be different from an end portion of the seventh photoresist pattern 20a (refer to FIG. 11A). The fourth position P4' may be located in the range of the tolerance from the second target position T2.

Exposed upper ones of the first insulation layers 14 and respective upper ones of the first sacrificial layers 12 therebeneath in the preliminary mold structure 50 may be etched using the tenth photoresist pattern 19a as an etching mask. Thus, a portion of a step structure may be formed at a sidewall of the preliminary mold structure 50 on the main region and the edge region.

The tenth photoresist pattern may have a shape different from a shape of the tenth photoresist pattern shown in FIG. 14 A, due to the tolerance in the EEW process. Thus, a step structure of the preliminary mold structure 50 may have a shape different from a shape of the step structure of the preliminary mold structure 50 shown in FIG. 14A.

Figure 27:
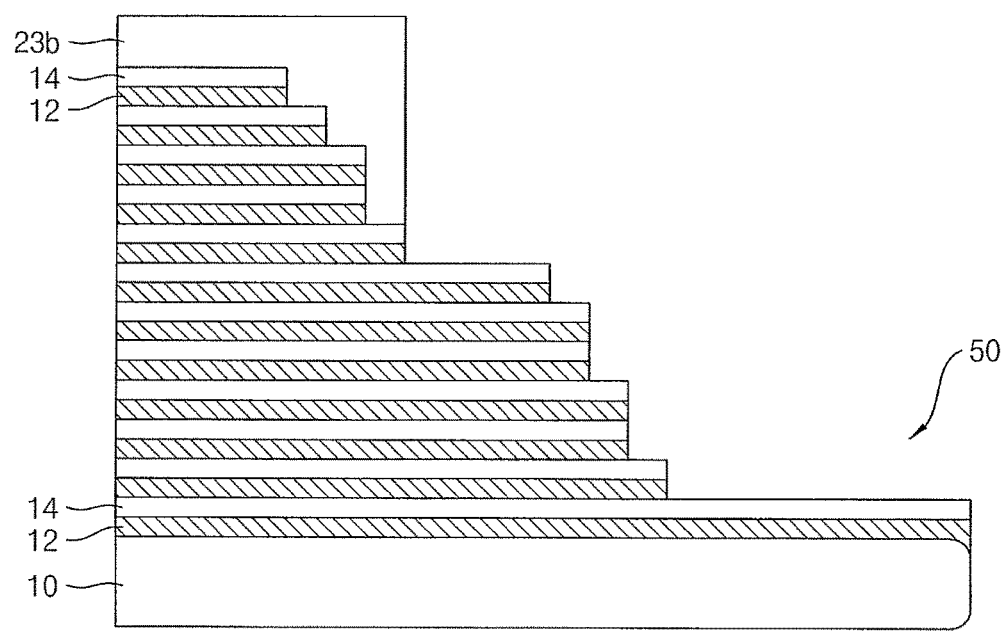

Referring to FIG. 27, an eleventh photoresist pattern 23b may be formed by a trimming process of the tenth photoresist pattern 23a. Exposed upper ones of the first insulation layers 14 and respective upper ones of the first sacrificial layers 12 therebeneath in the preliminary mold structure 50 may be etched using the eleventh photoresist pattern 23b as an etching mask.

Figure 28:
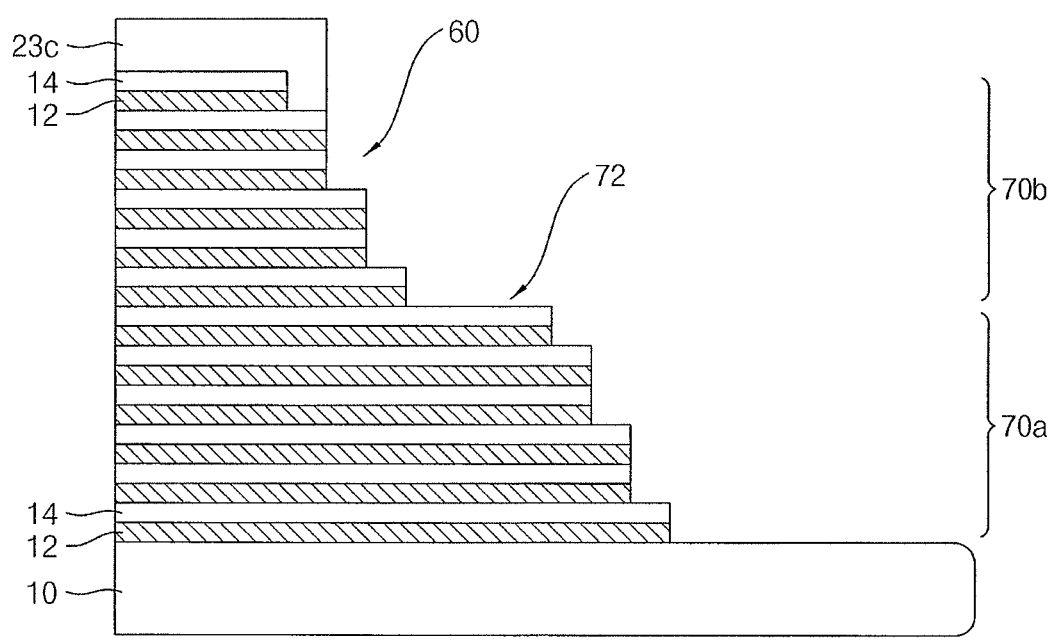

Referring to FIG. 28, a twelfth photoresist pattern 23c may be formed by a trimming process of the eleventh photoresist pattern 23b. Exposed upper ones of the first insulation layers 14 and respective upper ones of the first sacrificial layers 12 therebeneath in the preliminary mold structure 50 may be etched using the twelfth photoresist pattern 23c as an etching mask. Thus, the second mold structure 64 may be formed on the main region, and the first mold structure 60 may be formed on the edge region.

The first sidewall adjacent to the bevel region of the first mold structure 60 may include the first step portion 70a and the second step portion 70b above the first step portion 70a. The first step portion 70a may be formed by the EEW process using the first target position T1 of exposure. The second step portion 70b may be formed by the EEW process using the second target position T2 of exposure.

In example embodiments, a step layer 72 may be formed between the first and second step portions 70a and 70a, so that the first and second step portions 70a and 70b may be distinguished from each other by the step layer 72. In example embodiments, an upper surface of the step layer structure 72 may have a width in the first direction greater than a width in the first direction of each step of the first and second step portions 70a and 70b.

As described above, shapes of the first step portion and the second step portion of the first mold structure may be variously changed according to the tolerance of the target position of exposure. That is, steps of the first and second step portions 70a and 70b of the first mold structure 60 may have various shapes according to the tolerance of the target position of exposure, and may not be limited to the above-illustrated one.

Then, processes substantially the same as or similar to those illustrated with reference to FIGS. 17A to 21B are performed to form the vertical memory device.

FIGS. 29 to 35 are cross-sectional views illustrating stages of a method of manufacturing a vertical memory device in accordance with example embodiments.

The method of manufacturing the vertical memory device may include processes the same as or similar to those illustrated with reference to FIGS. 5A to 21B, except for the EEW processes. That is, the EEW processes may be performed using the second target position of exposure, and then the EEW processes may be performed using the first target position of exposure. In this case, when all of the EEW processes are performed without a tolerance of the target position of exposure, a step structure of the first mold structure may have a shape substantially the same as a shape of the step structure of the first mold structure shown in FIG. 3A.

In detail, first, processes substantially the same as or similar to those illustrated with reference to FIGS. 4A and 4B are performed, so that the preliminary mold structure 50 including the first sacrificial layers 12 and the first insulation layers 14 repeatedly and alternately stacked may be formed.

Figure 29:
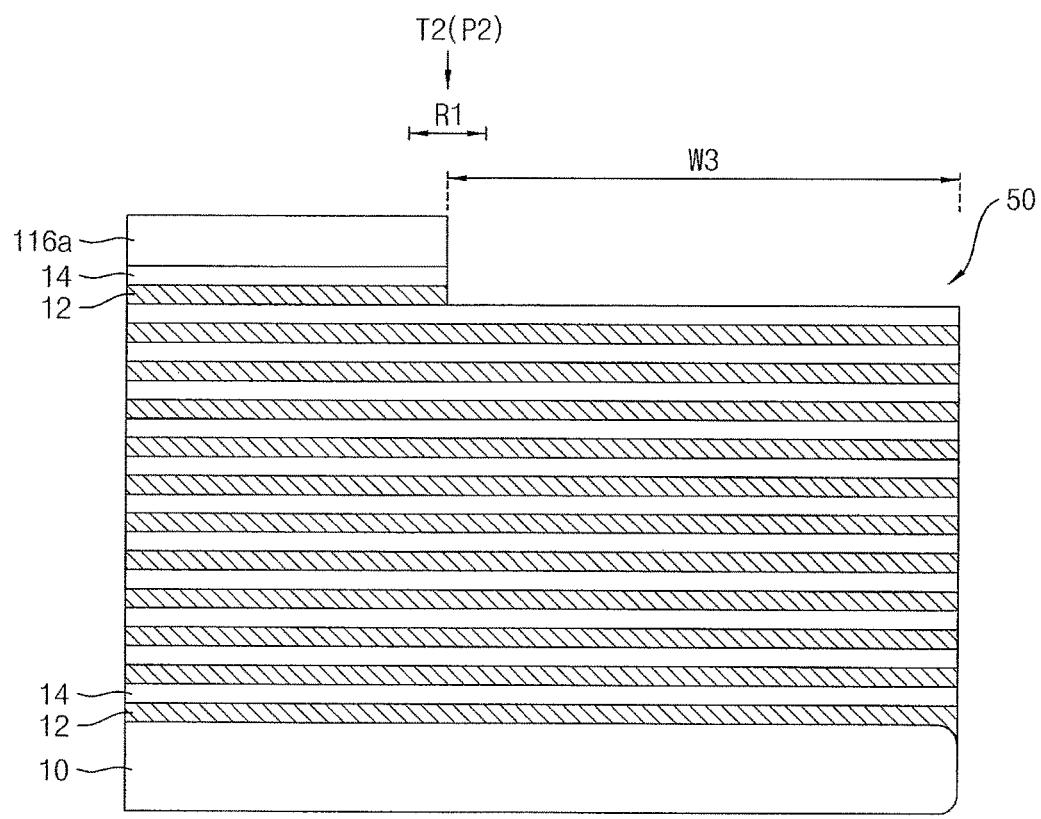
FIGS. 29 to 35 illustrate cross-sectional views of stages in a method of manufacturing a vertical memory device in accordance with example embodiments.

Referring to FIG. 29, a first photoresist film may be coated on the preliminary mold structure 50, and the first photoresist film may be exposed and developed to form a first photoresist pattern 116a. In an EEW process, the second target position T2 of exposure may be used.

In example embodiments, when the second target position T2 is exactly aligned without a tolerance, the end portion of the first photoresist pattern 23a may be located at the second portion P2 substantially the same as the second target position T2, as shown in FIG. 29.

Exposed upper ones of the first insulation layers 14 and respective upper ones of the first sacrificial layers 12 therebeneath in the preliminary mold structure 50 may be etched using the first photoresist pattern 116a as an etching mask.

Figure 30:
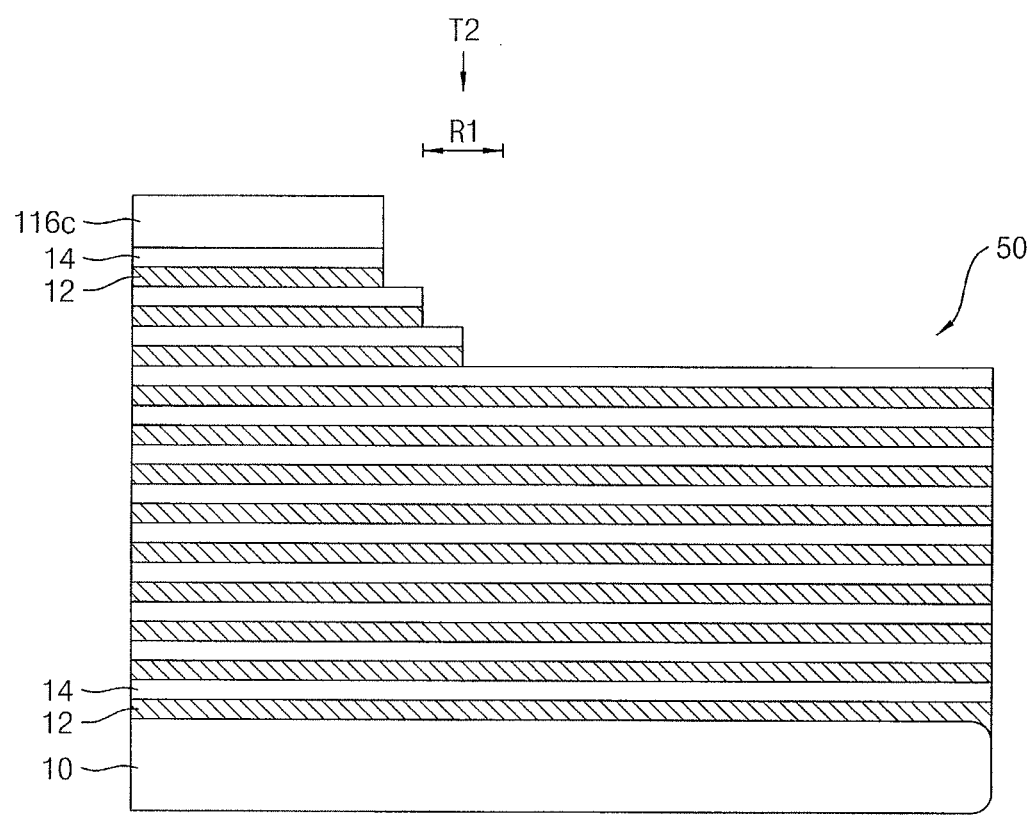

Referring to FIG. 30, a second photoresist pattern may be formed by a trimming process of the first photoresist pattern 116a. Exposed upper ones of the first insulation layers 14 and respective upper ones of the first sacrificial layers 12 therebeneath in the preliminary mold structure 50 may be etched using the second photoresist pattern as an etching mask. A third photoresist pattern 116c may be formed by a trimming process of the second photoresist pattern. Exposed upper ones of the first insulation layers 14 and respective upper ones of the first sacrificial layers 12 therebeneath in the preliminary mold structure 50 may be etched using the third second photoresist pattern 116c as an etching mask.

Figure 31:
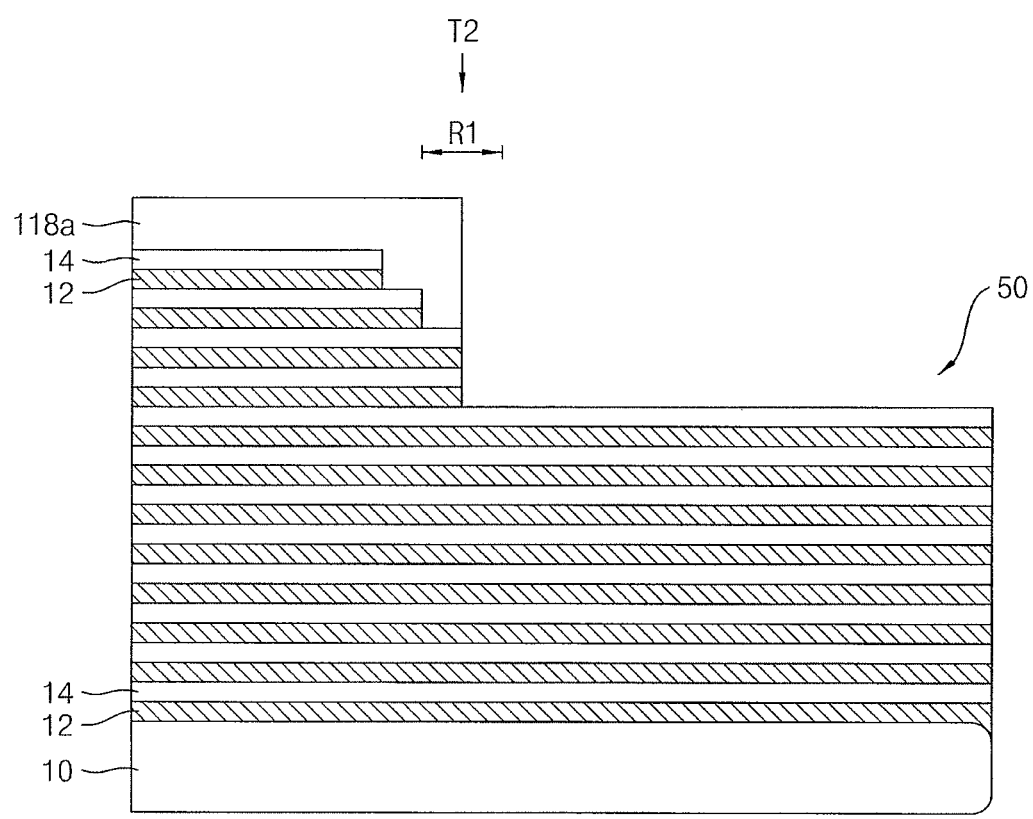

Referring to FIG. 31, a second photoresist film may be coated on the preliminary mold structure 50, and the second photoresist film may be exposed and developed to form a fourth photoresist pattern 118a. In an EEW process, the second target position T2 of exposure may be used.

In example embodiments, the end portion of the fourth photoresist pattern 118a may be exactly aligned with the second target position T2 without the tolerance, as shown in FIG. 31. Alternatively, the end portion of the fourth photoresist pattern 118a may not be exactly aligned with the second target position T2, due to the tolerance in the EEW process. That is, the end portion of the fourth photoresist pattern 118a may be located in the range of the tolerance from the second target position T2.

Exposed upper ones of the first insulation layers 14 and respective upper ones of the first sacrificial layers 12 thereneath in the preliminary mold structure 50 may be etched using the fourth photoresist pattern 118a as an etching mask.

Figure 32:
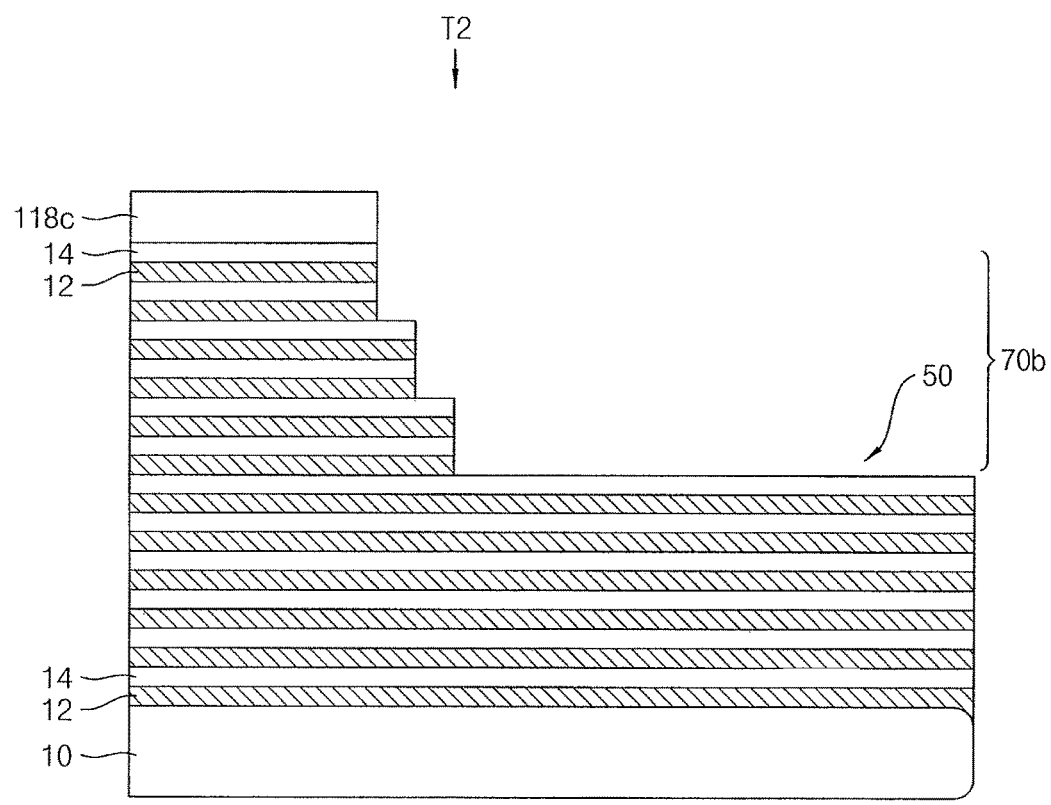

Referring to FIG. 32, a fifth photoresist pattern may be formed by a trimming process of the fourth photoresist pattern 118a. Exposed upper ones of the first insulation layers 14 and respective upper ones of the first sacrificial layers 12 therebeneath in the preliminary mold structure 50 may be etched using the fifth photoresist pattern as an etching mask. A sixth photoresist pattern 118c may be formed by a trimming process of the fifth photoresist pattern. Exposed upper ones of the first insulation layers 14 and respective upper ones of the first sacrificial layers 12 therebeneath in the preliminary mold structure 50 may be etched using the sixth photoresist pattern 118c as an etching mask. Thus, the second step layer 70b of the first mold structures 50 may be formed on the edge region.

Figure 33:
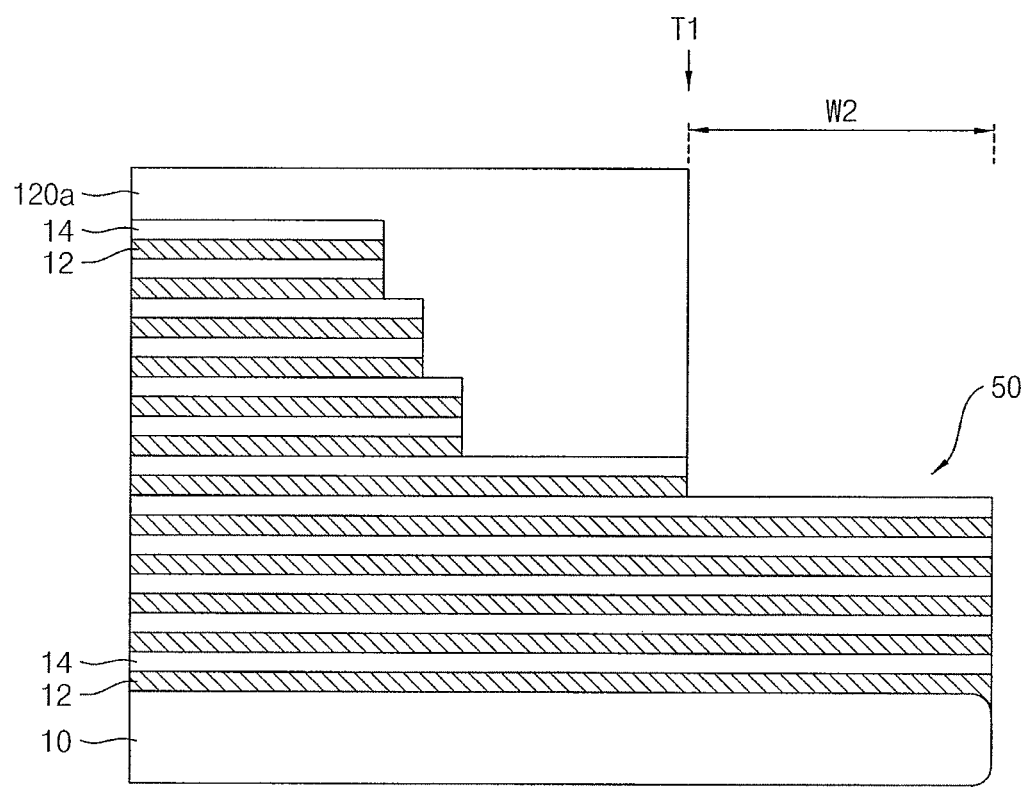

Referring to FIG. 33, a third photoresist film may be coated on the preliminary mold structure 50, and the third photoresist film may be exposed and developed to form a seventh photoresist pattern 120a.

In the EEW process, the first target position T1 different from the second target position T2 of exposure may be used. The second width W2 in the first direction between the first target position T1 and the boundary of the substrate 10 may be less than the third width W3 in the first direction between the second target position T2 and the boundary of the substrate 10.

Exposed upper ones of the first insulation layers 14 and respective upper ones of the first sacrificial layers 12 therebeneath in the preliminary mold structure 50 may be etched using the seventh photoresist pattern 120a as an etching mask.

Figure 34:
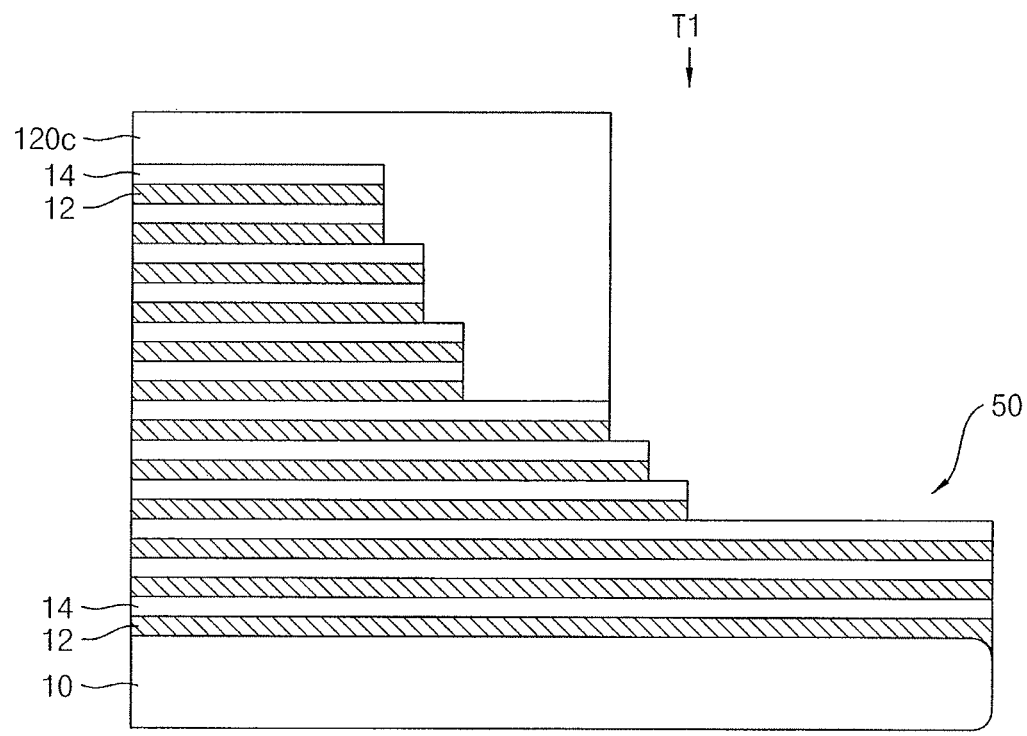

Referring to FIG. 34, an eighth photoresist pattern may be formed by a trimming process of the seventh photoresist pattern 120a. Exposed upper ones of the first insulation layers 14 and respective upper ones of the first sacrificial layers 12 therebeneath in the preliminary mold structure 50 may be etched using the eighth photoresist pattern as an etching mask. A ninth photoresist pattern 120c may be formed by a trimming process of the eighth photoresist pattern. Exposed upper ones of the first insulation layers 14 and respective upper ones of the first sacrificial layers 12 therebeneath in the preliminary mold structure 50 may be etched using the ninth photoresist pattern 120c as an etching mask.

Figure 35:
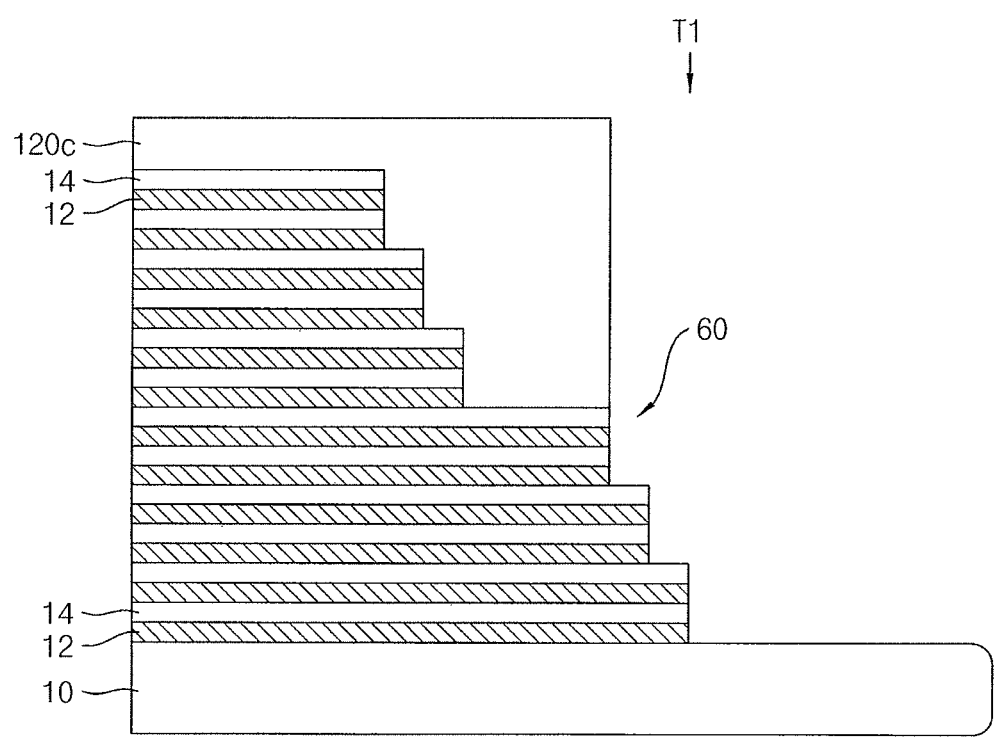

Referring to FIG. 35, forming a photoresist pattern, etching, trimming and etching may be sequentially performed to form the first step portion 70a, as those illustrated with reference to FIGS. 33 and 34. Thus, the first mold structure 60 including the first and second step portions 70a and 70b may be formed on the edge region. In the EEW process, the second target position T1 of exposure may be used.

As described above, the EEW processes may be performed using at least two of the target positions of exposures, respectively, so that a step structure of the first sidewall of the first mold structure 60 have a gentle slope. Then, processes substantially the same as or similar to those illustrated with reference to FIGS. 17A to 21B are performed to form the vertical memory device.

In the above, the EEW processes may be performed using two target positions of exposure. Alternatively, the EEW processes may be performed using three or more target position of exposure.

When the target positions are changed, the step portions may be distinguished from each other. Thus, the number of the target positions may be same as the number of the step portions. The step layers may be formed between the step portions, respectively, and an upper surface of each of the step layers may have a width in the first direction greater than a width in the first direction of an upper surface of each step of the step portions.

Figure 36:
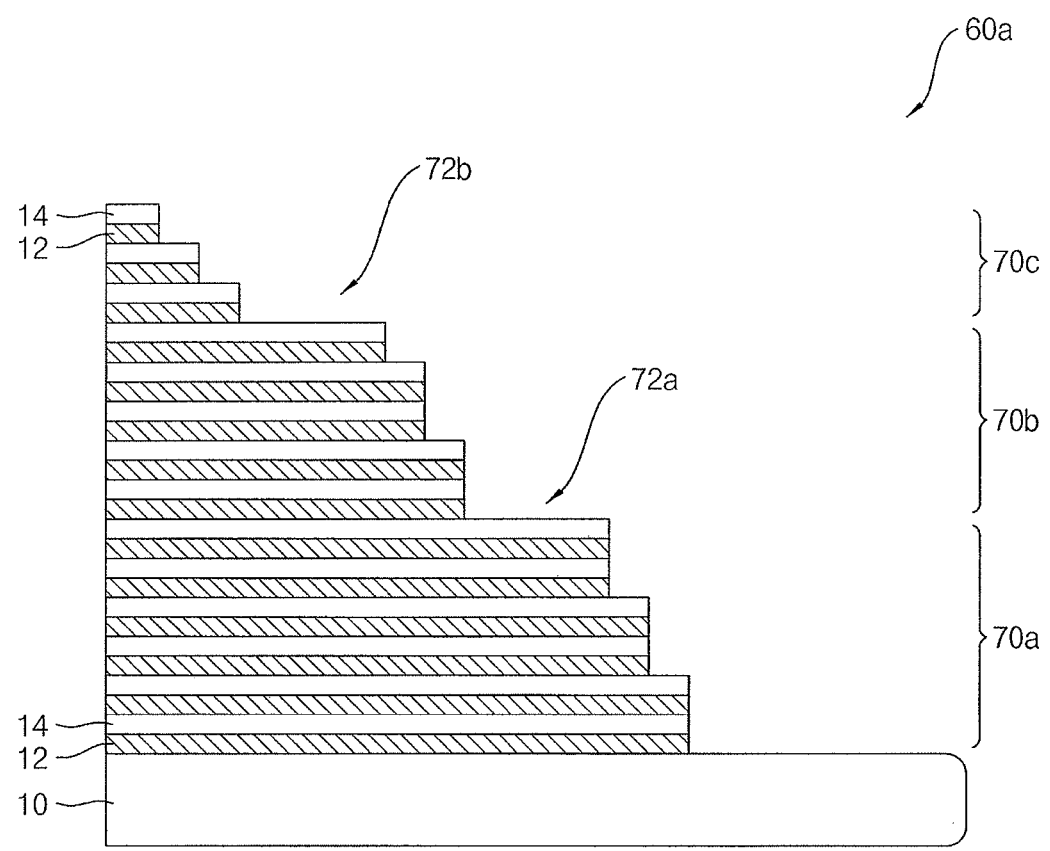
FIG. 36 illustrates a cross-sectional view of a vertical memory device in accordance with example embodiments.

FIG. 36 is a cross-sectional view illustrating vertical memory devices in accordance with example embodiments. In detail, FIG. 36 shows a mold structure on the edge region of the substrate 10.

Referring to FIG. 36, a first sidewall of the mold structure 60a may include the first step portion 70a, the second step portion 70b and a third step portion 70c. Also, a first step layer 72a may be formed between the first and second step portions 70a and 70b, and a second step layer 72b may be formed between the second and third step portions 70b and 70c.

The first step portion 70a may be formed by an EEW process using the first target position T1 of exposure. The second step portion 70b may be formed by an EEW process using the second target position T2 of exposure. The third step portion 70c may be formed by an EEW process using a third target position T3 of exposure.

As the number of the target positions in the EEW processes increases, an area of the substrate 10 for forming the first, second and third step portions 70a, 70b and 70c in the mold structure 60a may increase. Thus, the first sidewall of the mold structure 60a may have a gentle slope.

By way of summation and review, example embodiments provide a method of manufacturing a vertical memory device on an edge region of a substrate. That is, as described above, the mold structure on the edge region may be formed by EEW processes using at least two target positions of exposure to have a sidewall of a gentle slope, and thus the hard mask, e.g., an amorphous carbon layer, having a uniform thickness may be formed on the mold structure. When the channel hole is formed by the etching process, damages to the mold structure, e.g., due to contaminating particles and arcing, may decrease. Thus, the vertical memory device may have high reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a vertical memory device, the method comprising:

forming a preliminary first mold structure on a substrate, the substrate including a main region and an edge region, and the first preliminary mold structure including insulation layers and sacrificial layers alternately and repeatedly stacked;

forming a first mask on the preliminary first mold structure, the first mask exposing an upper surface of the preliminary first mold structure in a region between a boundary of the substrate and a first target position;

partially etching the insulation layers and the sacrificial layers using the first mask as an etching mask to form a preliminary second mold structure including a preliminary step structure;

forming a second mask on the preliminary second mold structure, the second mask exposing an upper surface of the preliminary second mold structure in a region between the boundary of the substrate and a second target position, wherein the second target position is different from the first target position; and partially etching the insulation layers and the sacrificial layers using the second mask as an etching mask to form a mold structure on the main region and the edge region of the substrate, wherein the mold structure on the edge region includes a first step portion formed by using the first mask and a second step portion formed by using the second mask, and wherein the mold structure includes a step layer between the first and the second step portions, the step layer distinguishing the first and second step portions from each other, and a width in a first direction of an exposed upper surface of the step layer being greater than a width in the first direction of an exposed upper surface of each step of the first and second step portions.

2. The method as claimed in claim 1, wherein each of the first and second masks includes a photoresist pattern, and the first and second masks are formed by an edge exposure wafer (EEW) process.

3. The method as claimed in claim 2, wherein the first hard mask is formed by an EEW process using a first target position of exposure, and the second hard mask is formed by an EEW process using a second target position of exposure.

4. The method as claimed in claim 2, wherein an end portion of the first mask is located in a range of a tolerance in the EEW process from the first target position, and an end portion of the second mask is located in a range of a tolerance in the EEW process from the second target position.

5. The method as claimed in claim 1, wherein partially etching the insulation layers and the sacrificial layers using the first mask as the etching mask to form the preliminary second mold structure including the preliminary step structure includes:

etching at least one of the insulation layers and at least one of the sacrificial layers using the first mask as an etching mask;

trimming a surface of the first mask to form a first trimmed etching mask;

etching at least one of the insulation layers and at least one of the sacrificial layers using the first trimmed etching mask as an etching mask; and repeating at least once the trimming and etching with respect to the first trimmed etching mask.

6. The method as claimed in claim 1, wherein the second mask is formed to expose an upper surface of the preliminary second mold structure, and wherein a second width between the second target position and the boundary of the substrate is greater than a first width between the first target position and the boundary of the substrate.

7. The method as claimed in claim 1, wherein a second width in a first direction between the second target position and the boundary of the substrate is less than a first width in the first direction between the first target position and the boundary of the substrate.

8. The method as claimed in claim 1, wherein partially etching the insulation layers and the sacrificial layers using the second mask as the etching mask to form the mold structure on the main region and the edge region of the substrate includes:

etching at least one of the insulation layers and at least one of the sacrificial layers using the second mask in the preliminary second mold structure as an etching mask;

trimming a surface of the second mask to form a second trimmed etching mask;

etching at least one of the insulation layers and at least one of the sacrificial layers using the second trimmed etching mask as an etching mask; and repeating at least once the trimming and etching with respect to the second trimmed etching mask.

9. The method as claimed in claim 1, further comprising, after forming the mold structure:

forming an insulating interlayer to cover the mold structure;

forming a hard mask layer on the insulating interlayer, the hard mask layer directly contacting a surface of the edge region of the substrate;

patterning the hard mask layer to form a hard mask including a hole; and etching the insulation layers and the sacrificial layers using the hard mask to form a channel hole exposing a surface of the substrate.

10. The method as claimed in claim 9, wherein the hard mask layer is formed of amorphous carbon by a chemical vapor deposition process.

11. A method of manufacturing a vertical memory device, the method comprising:

forming a preliminary mold structure on a substrate, the substrate including a main region and an edge region, and the preliminary mold structure including insulation layers and sacrificial layers alternately and repeatedly stacked;

forming a first mask on the preliminary mold structure on the main region of the substrate, the first mask serving as a mask for forming a step structure of the preliminary mold structure;

forming a second mask on the preliminary mold structure on the edge region of the substrate, the second mask exposing an upper surface of the preliminary mold structure on a first region between a boundary of the substrate and a first target position;

partially etching the insulation layers and the sacrificial layers using the first and second masks as an etching mask to form a first preliminary mold structure on the main region of the substrate and a second preliminary mold structure on the edge region of the substrate;

forming a third mask on the preliminary first mold structure, the third mask serving as a mask for forming a step structure of the preliminary first mold structure;

forming a fourth mask on the preliminary second mold structure, the fourth mask exposing an upper surface of the preliminary second mold structure on a region between the boundary of the substrate and a second target position, wherein the second target position is different from the first target position; and partially etching the insulation layers and the sacrificial layers using the third and fourth masks as an etching mask to form a second mold structure on the main region of the substrate and a first mold structure on the edge region of the substrate, wherein a sidewall of the second mold structure includes a first step structure, and a sidewall of the first mold structure includes a second step structure different from the first step structure.

12. The method as claimed in claim 11, wherein the third mask is formed to expose an edge portion of an uppermost layer in the preliminary first mold structure.

13. The method as claimed in claim 11, further comprising, after forming the first and second mold structures:

forming an insulating interlayer to cover the first and second mold structures;

forming a hard mask layer on the insulating interlayer, the hard mask layer directly contacting a surface of the edge region of the substrate;

patterning the hard mask layer to form a hard mask including a hole; and etching the insulation layers and the sacrificial layers using the hard mask to form a channel hole exposing a surface of the substrate.

14. The method as claimed in claim 11, wherein the hard mask layer is formed of amorphous carbon by a chemical vapor deposition process.

15. A method of manufacturing a vertical memory device, the method comprising:

forming a preliminary first mold structure on a substrate, the substrate including a main region and an edge region, and the first preliminary mold structure including insulation layers and sacrificial layers alternately and repeatedly stacked;

forming a first mask on the preliminary first mold structure, the first mask exposing an upper surface of the preliminary first mold structure in a region between a boundary of the substrate and a first target position;

partially etching the insulation layers and the sacrificial layers using the first mask as an etching mask to form a preliminary second mold structure including a preliminary step structure;

forming a second mask on the preliminary second mold structure, the second mask exposing an upper surface of the preliminary second mold structure in a region between the boundary of the substrate and a second target position, wherein the second target position is farther from the boundary of the substrate than the first target position; and partially etching the insulation layers and the sacrificial layers using the second mask as an etching mask to form a mold structure on the main region and the edge region of the substrate.

16. The method as claimed in claim 15, wherein the mold structure on the edge region includes a step structure with a first step portion formed by using the first mask and a second step portion formed by using the second mask, such that the.

17. The method as claimed in claim 16, wherein a width in a first direction of an exposed upper surface of a layer between the first and second step portions is greater than a width in the first direction of an exposed upper surface of each exposed upper surface in the first and second step portions.

18. The method as claimed in claim 17, wherein the width in the first direction of the exposed upper surface of the layer between the first and second step portions equals a distance between the first and second target positions.

19. The method as claimed in claim 16, wherein the first and second step portions are formed by different target positions of exposure.

* * * * *